United States Patent
Takamura et al.

(10) Patent No.: US 8,946,809 B2
(45) Date of Patent: Feb. 3, 2015

(54) METHOD FOR MANUFACTURING SEMICONDUCTOR MEMORY DEVICE AND SEMICONDUCTOR MEMORY DEVICE

(71) Applicant: Kabushiki Kaisha Toshiba, Minato-ku (JP)

(72) Inventors: Kazuhide Takamura, Mie-ken (JP); Ryota Katsumata, Mie-ken (JP); Masaru Kidoh, Mie-ken (JP); Yoshihiro Uozumi, Aichi-ken (JP); Daigo Ichinose, Mie-ken (JP); Toru Matsuda, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/017,472

(22) Filed: Sep. 4, 2013

(65) Prior Publication Data
US 2014/0284691 A1 Sep. 25, 2014

(30) Foreign Application Priority Data
Mar. 22, 2013 (JP) ................................. 2013-061112

(51) Int. Cl.
*H01L 29/792* (2006.01)
*G11C 11/34* (2006.01)
*H01L 21/8236* (2006.01)
(Continued)

(52) U.S. Cl.
CPC ........ *H01L 29/66833* (2013.01); *H01L 29/792* (2013.01); *H01L 21/8221* (2013.01); *H01L 27/1214* (2013.01)
USPC ........................ 257/324; 365/185.14; 438/268

(58) Field of Classification Search
CPC ................... H01L 21/8221; H01L 21/02104; H01L 21/28008; H01L 27/1214; H01L 27/12; H01L 27/105; H01L 29/792; H01L 29/673; H01L 29/401
USPC ............. 257/314, 324, 326; 365/185.01, 185, 365/17, 185.14, 185.26; 438/142, 591, 286, 438/599
See application file for complete search history.

(56) References Cited

U.S. PATENT DOCUMENTS 8,008,710 B2 * 8/2011 Fukuzumi et al. ............ 257/326
8,120,961 B2 2/2012 Katsumata et al.
(Continued)

FOREIGN PATENT DOCUMENTS

JP 2010-118530 5/2010
JP 2010-192531 9/2010
(Continued)

*Primary Examiner* — Nikolay Yushin
(74) *Attorney, Agent, or Firm* — Oblon, Spivak, McClelland, Maier & Neustadt, L.L.P.

(57) ABSTRACT

According to one embodiment, a method is disclosed for manufacturing a semiconductor memory device. The method includes forming a first stopper film forming a lower gate layer, making a recess in the lower gate layer, filling a sacrificial film into the recess, forming a second stopper film, making an opening in the second stopper film, forming a stacked body. The stacked body includes electrode films and insulating films. The method includes, making a slit in the stacked body, making a hole in the stacked body, removing the sacrificial film via the hole, forming a memory film including a charge storage film. The method includes forming a channel body on a side wall of the memory film. An etching rate of the first stopper film and the second stopper film is lower than an etching rate of the electrode films and the insulating films.

20 Claims, 24 Drawing Sheets

(51) Int. Cl.
*H01L 29/66* (2006.01)
*H01L 21/822* (2006.01)
*H01L 27/12* (2006.01)

(56) References Cited

U.S. PATENT DOCUMENTS

| | | | |
|---|---|---|---|
| 8,178,919 B2* | 5/2012 | Fujiwara et al. | 257/324 |
| 8,203,884 B2* | 6/2012 | Kito et al. | 365/185.18 |
| 8,258,033 B2 | 9/2012 | Watanabe | |
| 8,274,108 B2 | 9/2012 | Katsumata et al. | |
| 8,436,416 B2 | 5/2013 | Ichinose et al. | |
| 2010/0038703 A1* | 2/2010 | Fukuzumi et al. | 257/326 |
| 2010/0118610 A1 | 5/2010 | Katsumata et al. | |
| 2010/0207190 A1 | 8/2010 | Katsumata et al. | |
| 2010/0327339 A1* | 12/2010 | Tanaka et al. | 257/324 |
| 2011/0031547 A1 | 2/2011 | Watanabe | |
| 2011/0115014 A1 | 5/2011 | Ichinose et al. | |
| 2011/0291178 A1 | 12/2011 | Sasaki et al. | |
| 2012/0235221 A1* | 9/2012 | Ishiduki et al. | 257/324 |

FOREIGN PATENT DOCUMENTS

| | | |
|---|---|---|
| JP | 2011-40533 | 2/2011 |
| JP | 2011-108921 | 6/2011 |

* cited by examiner

METHOD FOR MANUFACTURING SEMICONDUCTOR MEMORY DEVICE AND SEMICONDUCTOR MEMORY DEVICE

CROSS-REFERENCE TO RELATED APPLICATION

This application is based upon and claims the benefit of priority from Japanese Patent Application No. 2013-061112, filed on Mar. 22, 2013; the entire contents of which are incorporated herein by reference.

FIELD

Embodiments described herein relate generally to a method for manufacturing a semiconductor memory device and a semiconductor memory device.

BACKGROUND

A memory device having a three-dimensional structure has been proposed in which memory holes are made in a stacked body in which inter-electrode insulating films are multiply stacked alternately with electrode films that function as control gates of memory cells, and silicon bodies used to form channels are provided on the side walls of the memory holes with a charge storage film interposed between the silicon bodies and the side walls.

The memory holes are made by etching the multiple electrode films and the multiple insulating films. In such a case, when step etching is performed by switching the etching gas between the electrode film and the insulating film, there is a risk of problems such as the processing time increasing and the control of the patterned configuration of the holes being difficult. Moreover, in the case where etching is performed unselectively and collectively by using the same gas for the electrode films and the insulating films, there is a risk that the holes may extend through to the layers under the stacked body.

DETAILED DESCRIPTION

Figure 1:
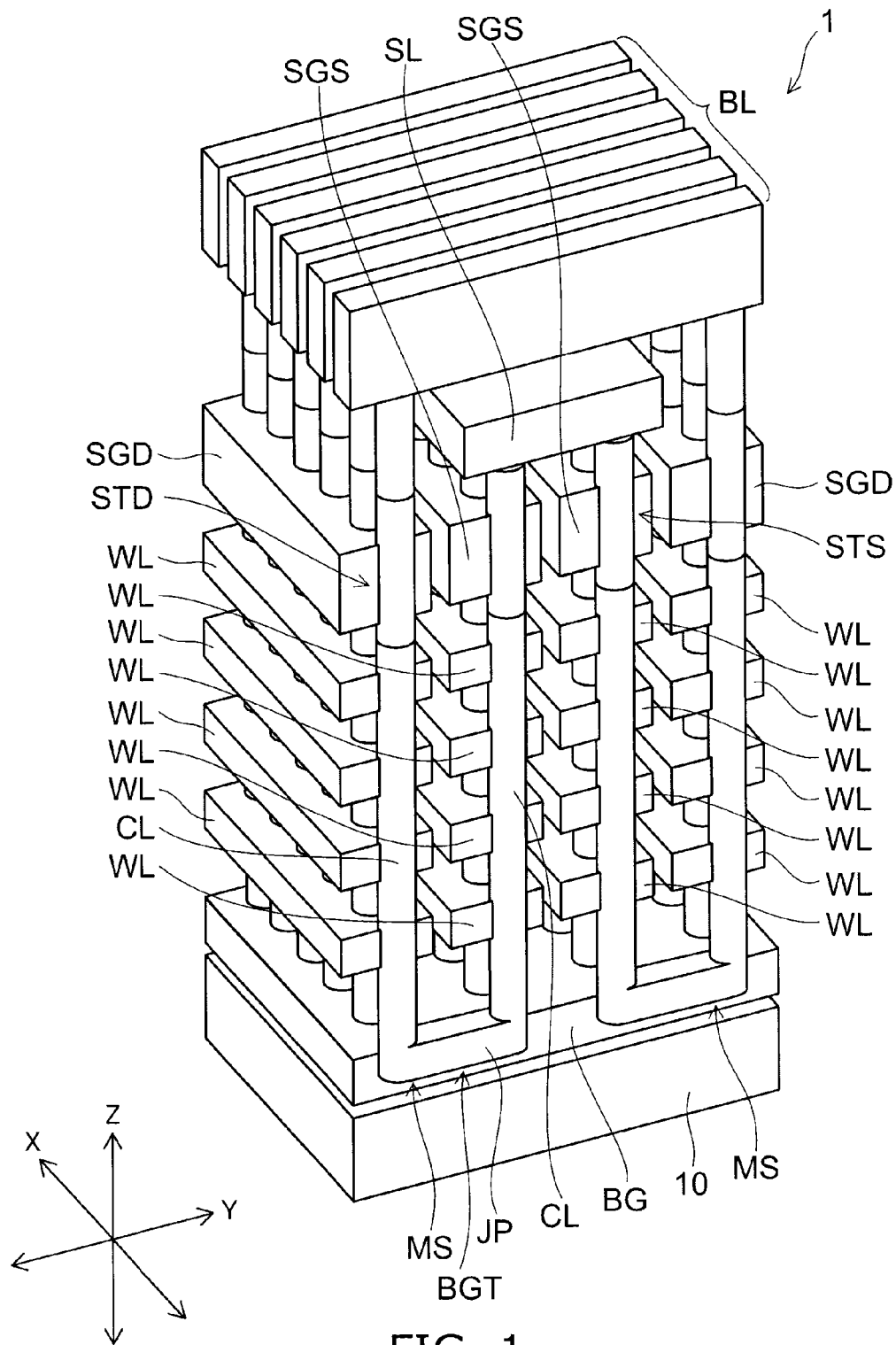
FIG. 1 is a schematic perspective view of a semiconductor memory device of an embodiment.

According to one embodiment, a method is disclosed for manufacturing a semiconductor memory device. The method can include forming a first stopper film on a substrate. The method can include forming a lower gate layer on the first stopper film. The method can include making a recess in the lower gate layer. The method can include filling a sacrificial film into the recess. The method can include forming a second stopper film on the sacrificial film and on the lower gate layer. The method can include making an opening in the second stopper film to expose a portion of the sacrificial film. The method can include forming a stacked body on the second stopper film. The stacked body includes a plurality of electrode films and a plurality of insulating films provided respectively between the electrode films. The method can include making a slit in the stacked body to reach the second stopper film. The method can include forming an insulating separation film inside the slit. The method can include making a hole in the stacked body to reach the first stopper film by piercing the stacked body and the opening. The method can include removing the sacrificial film via the hole. The method can include forming a memory film including a charge storage film on a side wall of the hole. In addition, the method can include forming a channel body on a side wall of the memory film. An etching rate of the first stopper film and the second stopper film is lower than an etching rate of the electrode films and the insulating films in the etching to make the slit and the etching to make the hole.

Various embodiments will be described hereinafter with reference to the accompanying drawings. Similar components in the drawings are marked with like reference numerals.

FIG. 1 is a schematic perspective view of a memory cell array 1 of a semiconductor memory device of an embodiment. In FIG. 1, the insulating portions, etc., are not shown for easier viewing of the drawing.

An XYZ orthogonal coordinate system is shown in FIG. 1. Two mutually orthogonal directions parallel to a major surface of a substrate 10 are taken as an X-direction (a first direction) and a Y-direction (a second direction); and a direction orthogonal to both the X-direction and the Y-direction is taken as a Z-direction (a third direction or the stacking direction).

Figure 8A:
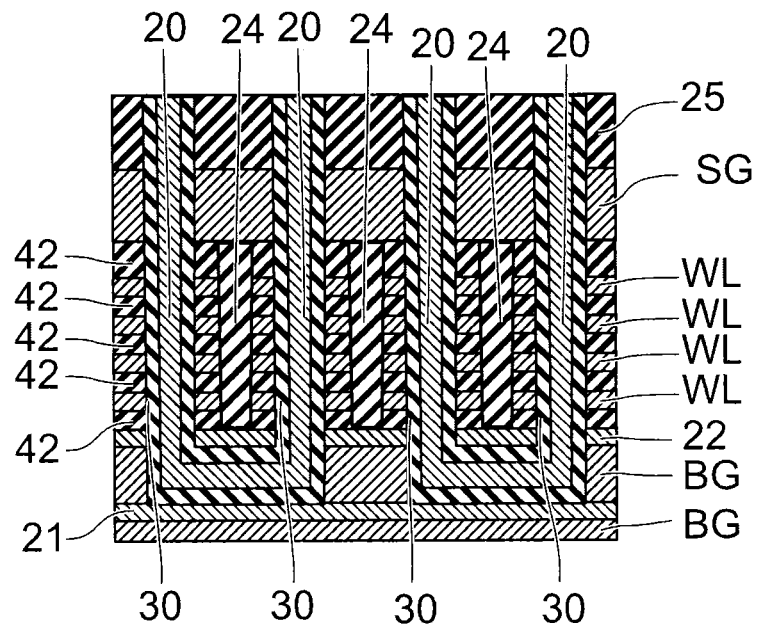
Figure 8B:
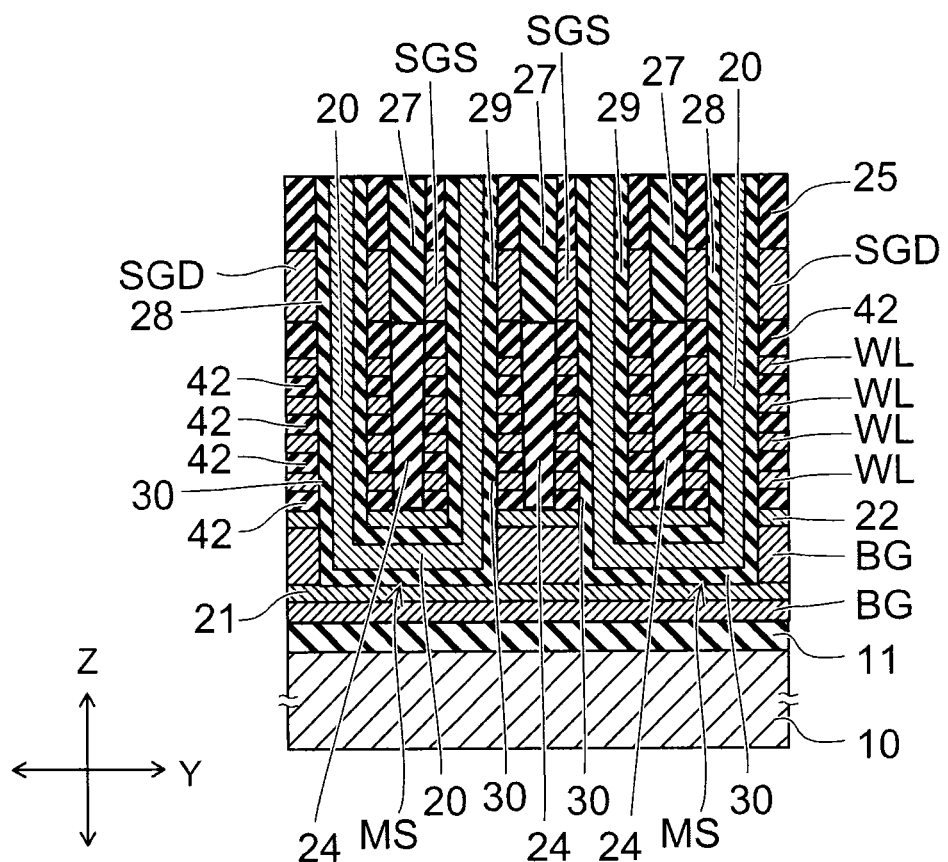

FIG. 8B is a schematic cross-sectional view of the memory cell array according to the first embodiment and shows a cross section parallel to the YZ plane of FIG. 1. A source line SL and bit lines BL that are shown in FIG. 1 are not shown in FIG. 8B.

The memory cell array includes multiple memory strings MS. One memory string MS is formed in a U-shaped configuration to include a pair of columnar portions CL that extends in the Z-direction and a linking portion JP that links the lower ends of the pair of columnar portions CL.

Figure 2:
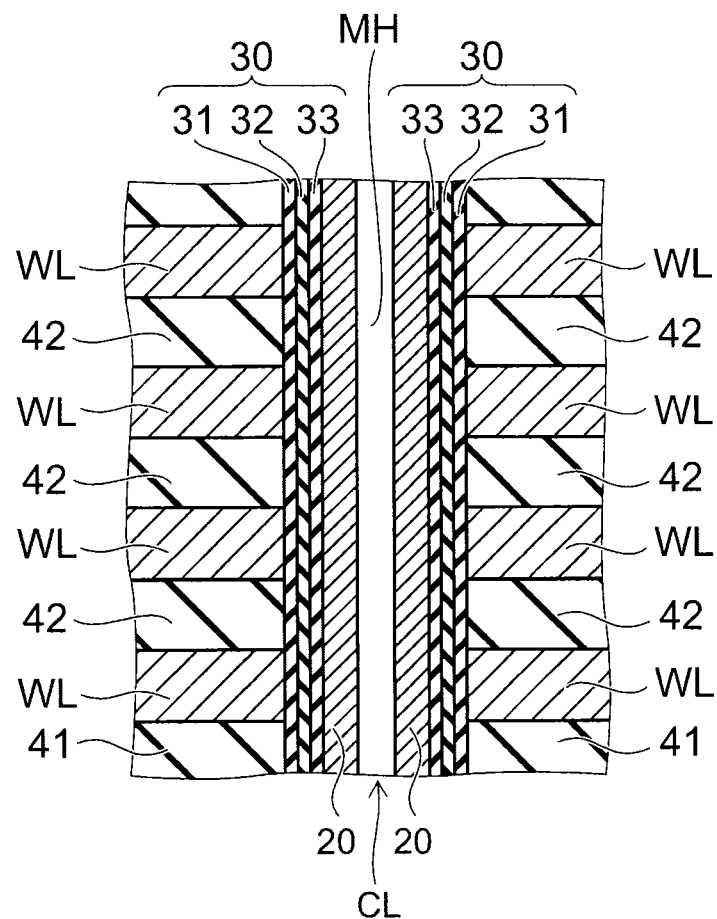
FIG. 2 is a schematic cross-sectional view of a portion of the semiconductor memory device of the embodiment.

FIG. 2 is an enlarged cross-sectional view of the columnar portion CL of the memory string MS.

As shown in FIG. 8B, a back gate BG is provided on the substrate 10 as a lower gate layer with an insulating film 11 interposed. The back gate BG is a conductive film and is, for example, a silicon film to which an impurity is added.

A first stopper film 21 is provided as a first protective film partway through the back gate BG in the thickness direction. The first stopper film 21 divides the back gate BG in the thickness direction. The portion of the back gate BG that is higher than the first stopper film 21 is thicker than the portion of the back gate BG that is lower than the first stopper film 21.

A second stopper film 22 is provided as a second protective film on the back gate BG. The portion of the back gate BG between the second stopper film 22 and the first stopper film 21 is thicker than the portion of the back gate BG that is lower than the first stopper film 21.

The first stopper film 21 and the second stopper film 22 are films of a different type of material than the back gate BG. The first stopper film 21 and the second stopper film 22 are made of the same material and are, for example, films including at least one selected from gold, silver, platinum, palladium, tantalum nitride, tantalum oxide, and aluminum oxide.

Insulating films 42 and electrode films WL are multiply stacked alternately with each other on the second stopper film 22. Although, for example, four layers of the electrode films WL are shown in FIG. 1 and FIG. 8B, the number of layers of the electrode films WL is arbitrary.

The insulating film 42 is provided between the adjacent electrode films WL on and under the insulating film 42 in the Z-direction. The insulating film 42 is provided also between the second stopper film 22 and the electrode film WL of the lowermost layer. The insulating film 42 is provided also on the electrode film WL of the uppermost layer.

The electrode film WL is, for example, a polycrystalline silicon film to which boron is added as an impurity and is sufficiently conductive to function as the gate electrode of the memory cell. The insulating film 42 is, for example, a silicon oxide film.

As shown in FIG. 1, a drain-side selection gate SGD is provided at one upper end portion of the pair of columnar portions CL of the memory string MS having the U-shaped configuration; and a source-side selection gate SGS is provided at the other upper end portion.

The drain-side selection gate SGD and the source-side selection gate SGS are provided on the electrode film WL of the uppermost layer with the insulating film 42 shown in FIG. 8B interposed between the drain-side selection gate SGD and the electrode film WL of the uppermost layer and between the source-side selection gate SGS and the electrode film WL of the uppermost layer.

In the description hereinbelow, there are cases where the drain-side selection gate SGD and the source-side selection gate SGS are called the selection gate SG without differentiating.

Similarly to the electrode film WL, the drain-side selection gate SGD and the source-side selection gate SGS are, for example, polycrystalline silicon films to which boron is added as an impurity and are sufficiently conductive to function as the gate electrodes of the selection transistors. The thickness of the drain-side selection gate SGD and the thickness of the source-side selection gate SGS are thicker than the thickness of each of the electrode films WL.

As shown in FIG. 8B, an insulating film 25 is formed on the drain-side selection gate SGD and on the source-side selection gate SGS. The source line SL shown in FIG. 1 is provided on the source-side selection gate SGS with the insulating film 25 interposed. The source line SL is, for example, a metal film.

As shown in FIG. 1, the bit lines BL which are multiple metal interconnects are provided on the drain-side selection gate SGD and the source line SL with a not-shown insulating film interposed between the drain-side selection gate SGD and the bit lines BL and between the source line SL and the bit lines BL. Each of the bit lines BL extends in the Y-direction.

As shown in FIG. 8B, the drain-side selection gate SGD and the source-side selection gate SGS are separated in the Y-direction by an insulating separation film 27. As described below, the insulating separation film 27 is filled into a slit that extends in the direction piercing the page surface in FIG. 8B.

The stacked body under the drain-side selection gate SGD is separated in the Y-direction from the stacked body under the source-side selection gate SGS by an insulating separation film 24. As described below, the insulating separation film 24 is filled into a slit that extends in the direction piercing the page surface in FIG. 8B. The slit is made in the stacked body that is on the second stopper film 22 by etching using the second stopper film 22 as an etching stopper. Accordingly, the insulating separation film 24 does not extend through the second stopper film 22; and the lower end of the insulating separation film 24 contacts the second stopper film 22.

The memory string MS includes a channel body 20 that is provided inside a memory hole made in a U-shaped configuration in the stacked body including the insulating film 25, the selection gates SG, the multiple insulating films 42, the multiple electrode films WL, the second stopper film 22, and the back gate BG.

The channel body 20 includes the pair of columnar portions CL that extends in the Z-direction through the stacked body recited above, and the linking portion JP that links the lower ends of the pair of columnar portions CL inside the back gate BG.

The channel body 20 is provided inside the memory hole having the U-shaped configuration with a memory film 30 interposed. The channel body 20 is, for example, a silicon film. As shown in FIG. 2, the memory film 30 is provided between the channel body 20 and the inner wall of a memory hole MH.

Although a structure in which the channel body 20 is provided such that a hollow portion remains at the central axis of the memory hole MH is shown in FIG. 2, a structure may be used in which the channel body 20 completely fills the interior of the memory hole MH or an insulating film is filled into the hollow portion inside the channel body 20.

As shown in FIG. 2, the memory film 30 includes a blocking film 31, a charge storage film 32, and a tunneling film 33. The blocking film 31, the charge storage film 32, and the tunneling film 33 are provided in order from the electrode film WL side between the channel body 20 and each of the electrode films WL. The blocking film 31 contacts each of the electrode films WL; the tunneling film 33 contacts the channel body 20; and the charge storage film 32 is provided between the blocking film 31 and the tunneling film 33.

The channel body 20 functions as a channel of the memory cells (the memory cell transistors); the electrode films WL function as control gates of the memory cells; and the charge storage film 32 functions as a data storage layer that stores the charge injected from the channel body 20. In other words, the memory cells are formed at the intersections between the channel body 20 and each of the electrode films WL and have a structure in which the control gate is provided around the channel.

The semiconductor memory device of the embodiment is a nonvolatile semiconductor memory device that can freely and electrically erase/program data and retain the memory content even when the power supply is OFF.

The memory cell is, for example, a charge trap memory cell. The charge storage film 32 has many trap sites that trap the charge and is, for example, a silicon nitride film.

The tunneling film 33 is used as a potential barrier when the charge is injected from the channel body 20 into the charge storage film 32 or when the charge stored in the charge storage film 32 diffuses into the channel body 20. The tunneling film 33 is, for example, a silicon oxide film.

The blocking film 31 prevents the charge stored in the charge storage film 32 from diffusing into the electrode film WL. The blocking film 31 is, for example, a silicon nitride film or an aluminum oxide (alumina) film.

As shown in FIG. 8B, a gate insulating film 28 is provided between the drain-side selection gate SGD and the channel body 20. The drain-side selection gate SGD, the channel body 20, and the gate insulating film 28 are included in a drain-side selection transistor STD (shown in FIG. 1). As shown in FIG. 1, the channel body 20 is connected to the bit line BL above the drain-side selection gate SGD.

As shown in FIG. 8B, a gate insulating film 29 is provided between the source-side selection gate SGS and the channel body 20. The source-side selection gate SGS, the channel body 20, and the gate insulating film 29 are included in a source-side selection transistor STS (shown in FIG. 1). As shown in FIG. 1, the channel body 20 is connected to the source line SL above the source-side selection gate SGS.

The back gate BG, the channel body 20 provided inside the back gate BG, and the memory film 30 provided inside the back gate BG are included in a back gate transistor BGT (shown in FIG. 1).

The memory cells having the electrode films WL as control gates are multiply provided between the drain-side selection transistor STD and the back gate transistor BGT. Similarly, the memory cells having the electrode films WL as control gates are multiply provided between the back gate transistor BGT and the source-side selection transistor STS.

The multiple memory cells, the drain-side selection transistor STS, the back gate transistor BGT, and the source-side selection transistor STD are connected in series via the channel body 20 and are included in one memory string MS having a U-shaped configuration. By the memory string MS being multiply arranged in the X-direction and the Y-direction, multiple memory cells MC are provided three-dimensionally in the X-direction, the Y-direction, and the Z-direction.

A method for manufacturing the semiconductor memory device according to the first embodiment will now be described with reference to FIG. 3A to FIG. 8B.

Figure 3A:
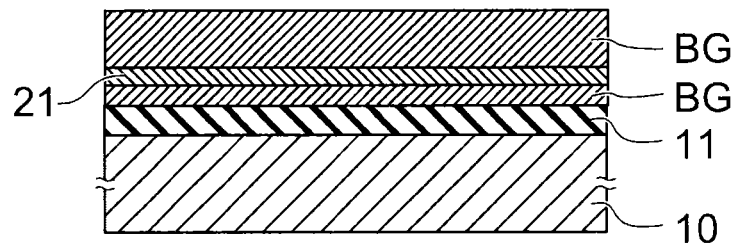
FIG. 3A to FIG. 8B are schematic cross-sectional views showing a method for manufacturing a semiconductor memory device according to a first embodiment.

As shown in FIG. 3A, the back gate BG is formed on the substrate 10 with the insulating film (e.g., the silicon oxide film) interposed. The back gate BG is, for example, a polycrystalline silicon film to which boron (B) is added as an impurity. The substrate 10 and the insulating film 11 are not shown in FIG. 3B and subsequent drawings.

The first stopper film 21 is formed on the back gate BG; and the back gate BG is formed again on the first stopper film 21.

Figure 3B:
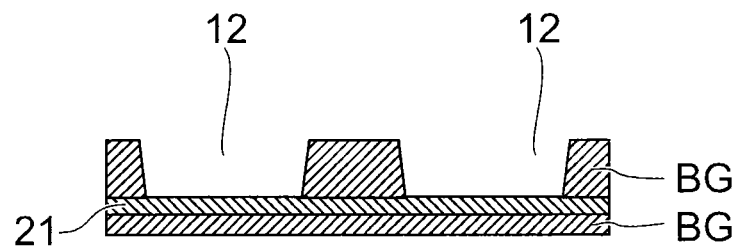

As shown in FIG. 3B, multiple recesses 12 are made in the back gate BG that is on the first stopper film 21 by etching using a not-shown resist film. The recesses 12 reach the first stopper film 21 to expose the first stopper film 21 at the bottoms of the recesses 12.

Figure 3C:
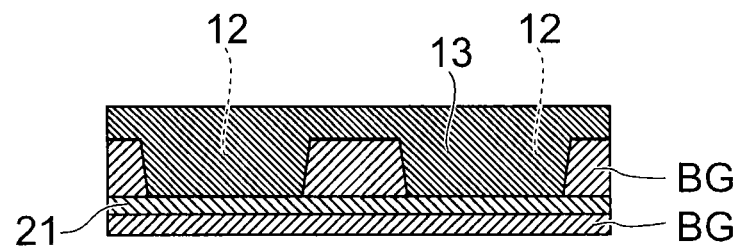

As shown in FIG. 3C, a sacrificial film 13 is filled into the recesses 12. The sacrificial film 13 is, for example, a non-doped polycrystalline silicon film. Herein, being non-doped means that impurities that provide conductivity are not deliberately added to the silicon film; and impurities other than the elements due to the source-material gas in the film formation substantially are not included.

Figure 3D:
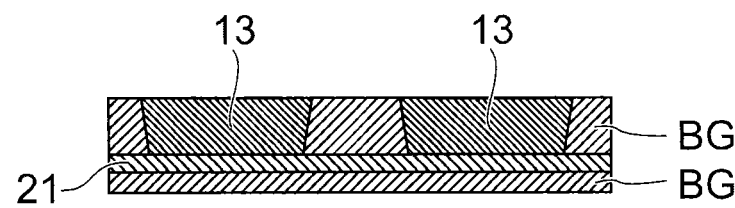

Etch-back of the sacrificial film 13 is performed to expose the upper surface of the back gate BG as shown in FIG. 3D. The upper surface of the sacrificial film 13 is caused to be the same height as the upper surface of the back gate BG.

Figure 4A:
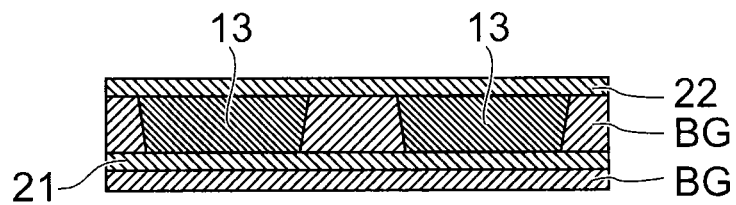

As shown in FIG. 4A, the second stopper film 22 is formed on the upper surface of the back gate BG and on the upper surface of the sacrificial film 13.

The first stopper film 21 and the second stopper film 22 are films of a different type of material than the back gate BG and the sacrificial film 13; and the first stopper film 21 and the second stopper film 22 are, for example, films including at least one selected from gold, silver, platinum, palladium, tantalum nitride, tantalum oxide, and aluminum oxide.

Figure 4B:
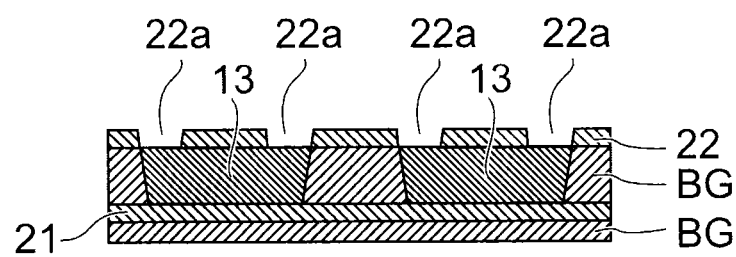

As shown in FIG. 4B, an opening 22a is made in the second stopper film 22 using a not-shown resist film. A portion of the sacrificial film 13 is exposed in the opening 22a. An opening is not made in the second stopper film 22 that is formed on the upper surface of the back gate BG; and the back gate BG is not exposed.

Figure 4C:
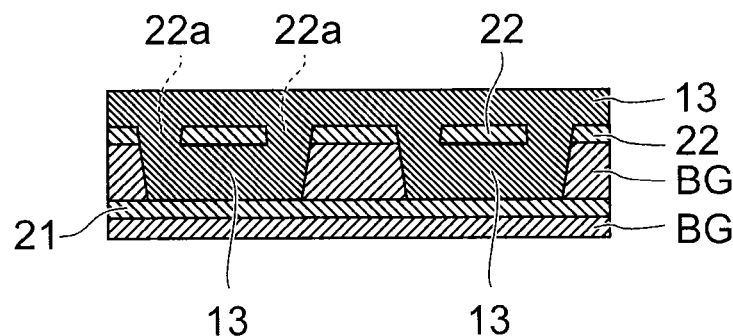

Then, as shown in FIG. 4C, the sacrificial film 13 is deposited again onto the second stopper film 22 to fill the opening 22a.

Figure 4D:
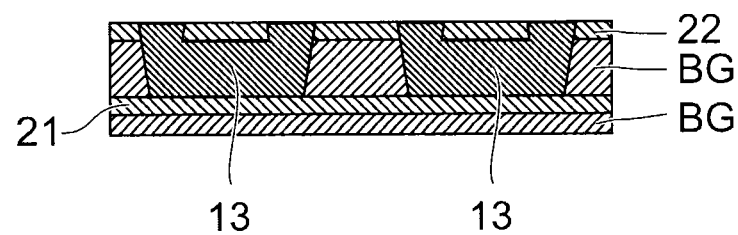

Etch-back of the sacrificial film 13 that is on the second stopper film 22 is performed to remove the sacrificial film 13 that is on the second stopper film 22 as shown in FIG. 4D. At this time, the second stopper film 22 has etching resistance to the etching and functions as an etching stopper.

The second stopper film 22 is exposed to planarize to cause the upper surface of the sacrificial film 13 filled into the opening 22a to be substantially the same height as the upper surface of the second stopper film 22. Thereby, the flatness of each of the films of the stacked body that is formed in subsequent processes can be ensured.

Figure 5A:
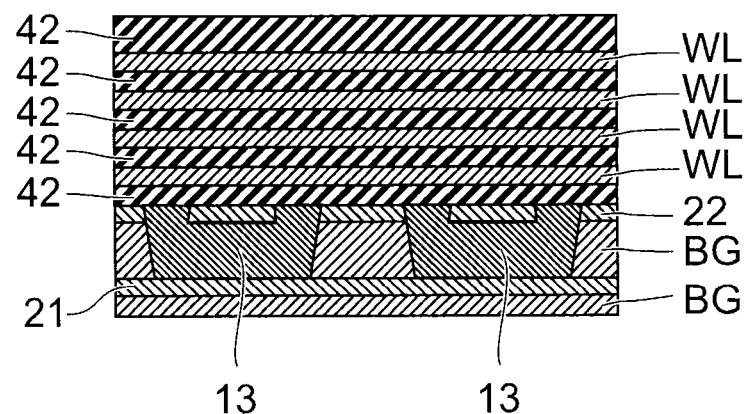
Figure 5B:
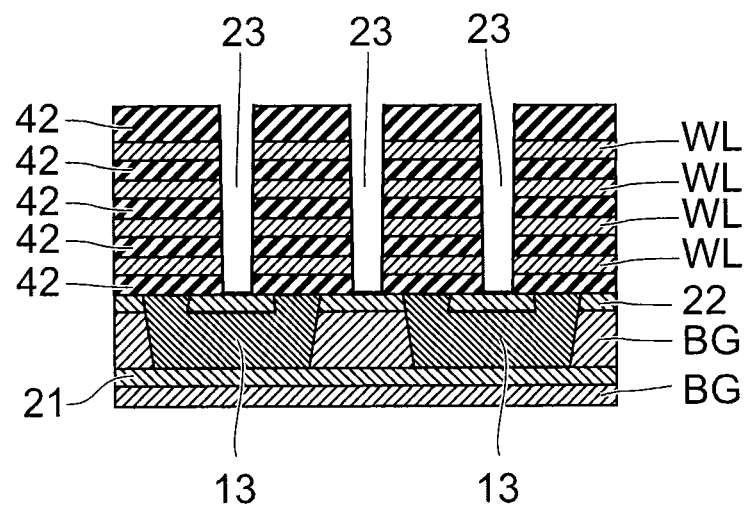

As shown in FIG. 5A, the insulating films 42 and the electrode films WL are multiply stacked alternately with each other on the second stopper film 22 and on the sacrificial film 13. The insulating film 42 is formed in the uppermost layer.

The electrode films WL are, for example, polycrystalline silicon films to which boron (B) is added as an impurity. The insulating films 42 are, for example, silicon oxide films.

After forming the stacked body shown in FIG. 5A, multiple slits 23 are made by RIE (Reactive Ion Etching) using a not-shown mask. The slits 23 extend in the stacking direction of the electrode films WL and the insulating films 42 through the stacked body that is on the second stopper film 22. Further, the slits 23 extend in the direction piercing the page surface of FIG. 5B to divide the stacked body that is on the second stopper film 22 in the lateral direction (in FIG. 8B, the Y-direction).

The multiple electrode films WL and the multiple insulating films 42 that are stacked alternately with each other are etched unselectively and collectively by, for example, RIE using the same gas including HBr, $C_4F_8$, $CF_4$, or $NF_3$. The etching gas is not switched between the films.

In the etching, the etching resistance of the second stopper film 22 is higher than that of the electrode films WL and the insulating films 42; and the second stopper film 22 is substantially not etched. Accordingly, the etching can be reliably stopped at the second stopper film 22; and the slits 23 do not extend below the stacked body recited above.

In other words, the etching that progresses downward from the stacked body is stopped at the second stopper film 22. The second stopper film 22 is exposed at the bottoms of the slits 23.

Figure 6A:
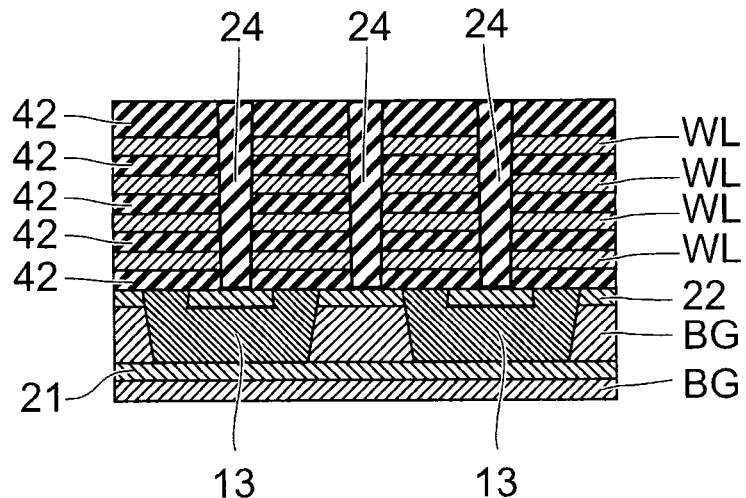

As shown in FIG. 6A, the insulating separation film 24 is filled into the slits 23. The insulating separation film 24 is, for example, a silicon nitride film.

Figure 6B:
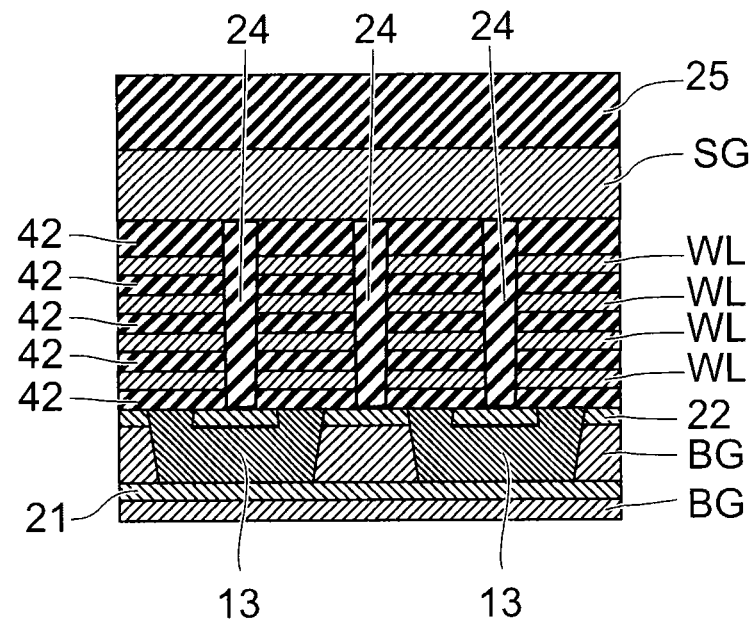

As shown in FIG. 6B, the selection gate SG is formed as the upper gate layer on the insulating film 42 of the uppermost layer and on the upper surface of the insulating separation film 24. The insulating film 25 is formed on the selection gate SG. The selection gate SG is, for example, a polycrystalline silicon film to which boron (B) is added as an impurity. The insulating film 25 is, for example, a silicon oxide film.

Each of the stacked films on the second stopper film 22 shown in FIG. 6B are formed using, for example, CVD (Chemical Vapor Deposition).

Figure 7A:
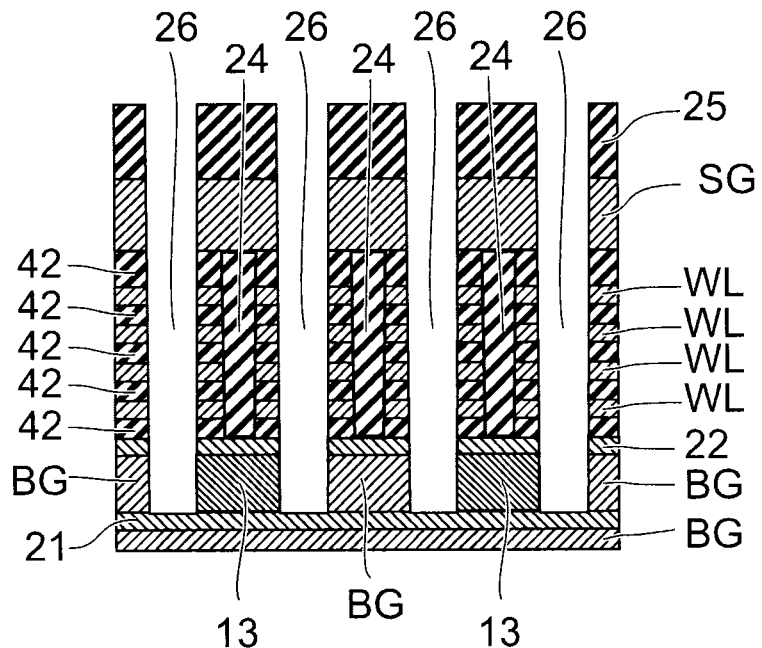

After forming the stacked body shown in FIG. 6B, multiple holes 26 are made in the stacked body as shown in FIG. 7A by RIE using a not-shown mask.

The holes 26 extend through the insulating film 25, the selection gates SG, the multiple insulating films 42, and the multiple electrode films WL in the stacking direction of these films to reach the first stopper film 21 by piercing the opening 22a made in the second stopper film 22 and the sacrificial film 13 under the opening 22a.

The sacrificial film 13 remains between the lower end portions of the pair of holes 26 adjacent to each other in the lateral direction of FIG. 7A (in FIG. 8B, the Y-direction). The side surfaces of the sacrificial film 13 face the holes 26.

The insulating film 25, the selection gate SG, the multiple electrode films WL, the multiple insulating films 42, and the sacrificial film 13 are etched unselectively and collectively by, for example, RIE using the same gas including HBr, $C_4F_8$, $CF_4$, or $NF_3$. The etching gas is not switched between the films.

In the etching, the etching resistance of the first stopper film 21 is higher than that of the insulating film 25, the selection gate SG, the electrode films WL, the insulating films 42, and the sacrificial film 13; and the first stopper film 21 is substantially not etched. Accordingly, the etching can be reliably stopped at the first stopper film 21; and the holes 26 do not extend through to the substrate 10 shown in FIG. 8B.

In other words, the etching that progresses downward from the stacked body recited above is stopped at the first stopper film 21. The first stopper film 21 is exposed at the bottoms of the holes 26.

After making the holes 26, the sacrificial film 13 which is the non-doped silicon film is removed via the holes 26 by, for example, chemical liquid processing (wet etching) using TMY (trimethyl-2-hydroxyethyl ammonium hydroxide).

At this time, the first stopper film 21 and the second stopper film 22 also have resistance to the chemical liquid processing and are not etched.

Figure 7B:
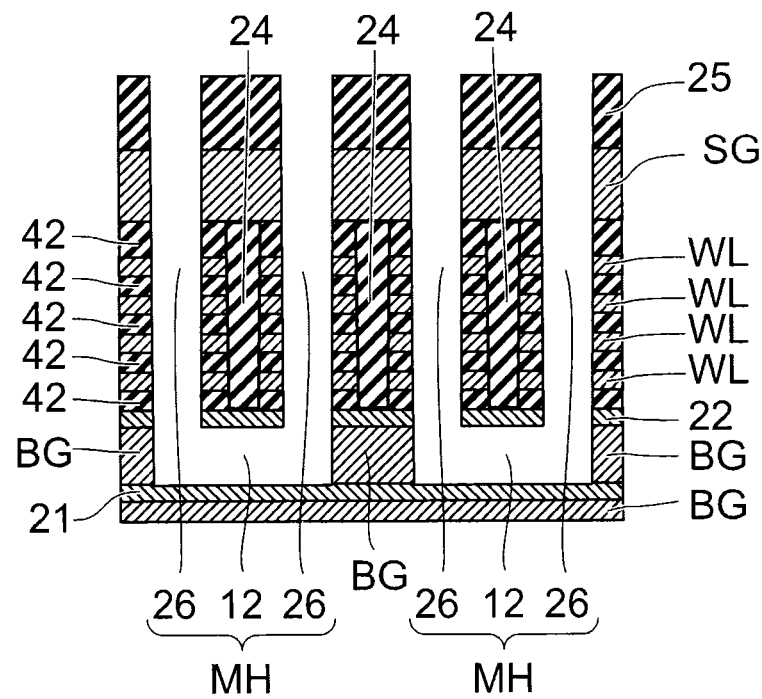

As shown in FIG. 7B, the recesses 12 made in the back gate BG appear by the removal of the sacrificial film 13 remaining inside the recesses 12 of the back gate BG. One recess 12 communicates with a pair of holes 26. In other words, the bottoms of a pair of holes 26 communicate with one common recess 12 to make one memory hole MH in a U-shaped configuration.

After making the memory hole MH, the memory film 30 is formed on the inner wall of the memory hole MH as shown in FIG. 8A. As described above referring to FIG. 2, the memory film 30 includes the blocking film 31, the charge storage film 32, and the tunneling film 33 stacked in order from the electrode film WL side.

After forming the memory film 30, the channel body 20 is formed on the inner side of the memory film 30 inside the memory hole MH. The memory film 30 and the channel body 20 also are formed inside the recess 12 of the back gate BG.

Subsequently, the selection gate SG is divided into the drain-side selection gate SGD and the source-side selection gate SGS by slits and the insulating separation film 27 (shown in FIG. 8B) that is filled into the slits. Subsequently, not-shown contacts, the source line SL and the bit lines BL shown in FIG. 1, etc., are formed.

According to the embodiment described above, the first stopper film 21 and the second stopper film 22 are formed respectively on the lower layer portion of the back gate BG and the upper surface of the back gate BG.

Therefore, when making the slits 23 and the holes 26 in the stacked body in which the multiple electrode films WL and the multiple insulating films 42 are stacked alternately with each other, the etching can be stopped reliably at the first stopper film 21 and the second stopper film 22 while efficiently etching the multiple electrode films WL and the multiple insulating films 42 by unselective etching without switching the etching gas between the films.

Because the etching is unselective etching, compared to step etching in which the etching gas is switched between the films of the electrode films WL and the insulating films 42, the processing time is short; and side etching can be suppressed such that it is possible to make the slits 23 and the holes 26 to extend substantially perpendicular to the front surface of the substrate 10.

A method for manufacturing a semiconductor memory device according to a second embodiment will now be described with reference to FIG. 9A to FIG. 13B.

Figure 9A:
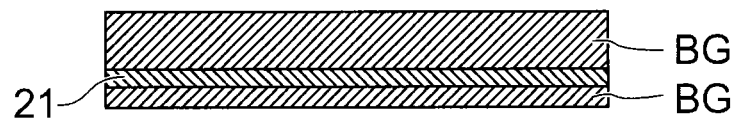
FIG. 9A to FIG. 13B are schematic cross-sectional views showing a method for manufacturing a semiconductor memory device according to a second embodiment.

In the second embodiment as well, similarly to the first embodiment, the first stopper film 21 is formed in a portion of the back gate BG on the lower layer side as shown in FIG. 9A.

Similarly to the first embodiment shown in FIG. 3A, the stacked film of the back gate BG and the first stopper film 21 is formed on the substrate 10 with the insulating film 11 interposed.

Figure 9B:
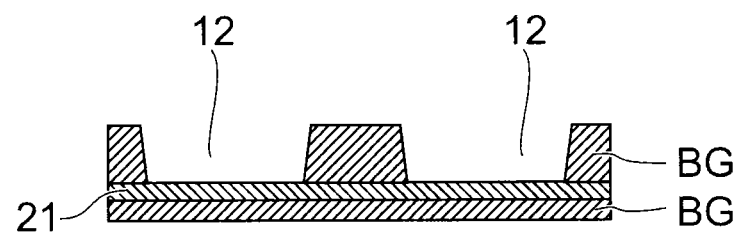

As shown in FIG. 9B, the multiple recesses 12 are made in the back gate BG by etching using a not-shown resist film. The recesses 12 reach the first stopper film 21 to expose the first stopper film 21 at the bottoms of the recesses 12.

Figure 9C:
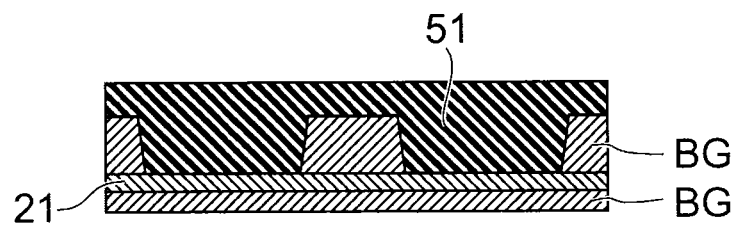

As shown in FIG. 9C, a sacrificial film 51 is filled into the recesses 12. The sacrificial film 51 is, for example, a silicon oxide film.

Figure 9D:
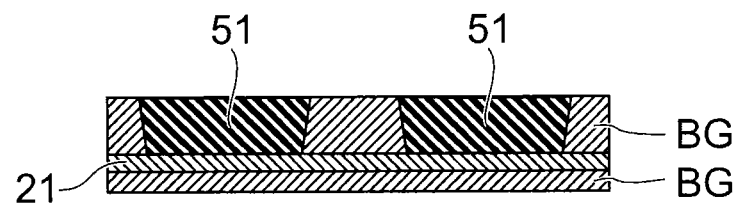

Etch-back of the sacrificial film 51 is performed to expose the upper surface of the back gate BG as shown in FIG. 9D. The upper surface of the sacrificial film 51 is caused to be the same height as the upper surface of the back gate BG.

Figure 10A:
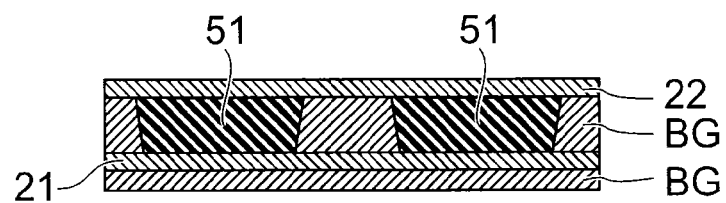

As shown in FIG. 10A, the second stopper film 22 is formed on the upper surface of the back gate BG and on the upper surface of the sacrificial film 51.

The first stopper film 21 and the second stopper film 22 are films of a different type of material than the back gate BG and the sacrificial film 51.

Figure 10B:
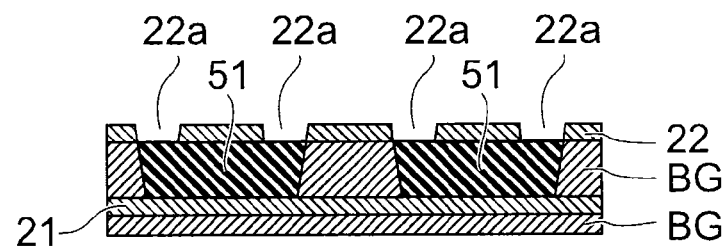

As shown in FIG. 10B, the opening 22a is made in the second stopper film 22 using a not-shown resist film. A portion of the sacrificial film 51 is exposed in the opening 22a. An opening is not made in the second stopper film 22 that is formed on the upper surface of the back gate BG; and the back gate BG is not exposed.

Figure 10C:
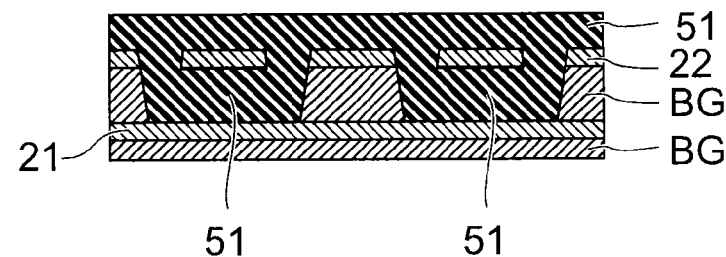

Then, as shown in FIG. 10C, the sacrificial film 51 is deposited again onto the second stopper film 22 to fill the opening 22a.

Figure 10D:
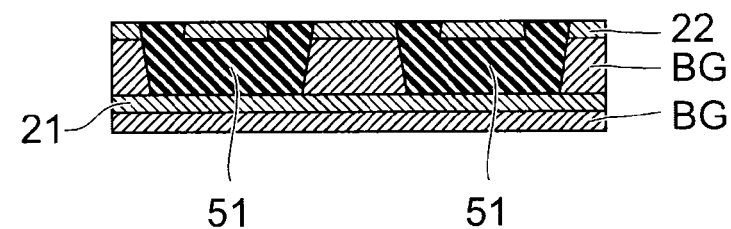

Etch-back of the sacrificial film 51 that is on the second stopper film 22 is performed to remove the sacrificial film 51 that is on the second stopper film 22 as shown in FIG. 10D. At this time, the second stopper film 22 has etching resistance to the etching and functions as an etching stopper.

The second stopper film 22 is exposed to planarize to cause the upper surface of the sacrificial film 51 filled into the opening 22a to be substantially the same height as the upper surface of the second stopper film 22. Thereby, the flatness of each of the films of the stacked body that is formed in subsequent processes can be ensured.

Figure 11A:
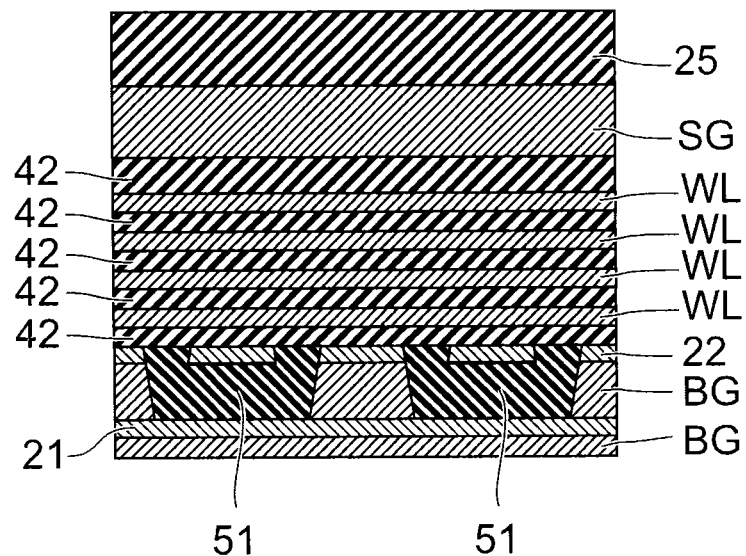

As shown in FIG. 11A, the insulating films 42 and the electrode films WL are multiply stacked alternately with each other on the second stopper film 22 and on the sacrificial film 51. The insulating film 42 is formed in the uppermost layer. Further, the selection gate SG is formed as the upper gate layer on the insulating film 42 of the uppermost layer. The insulating film 25 is formed on the selection gate SG.

The electrode film WL and the selection gate SG are, for example, polycrystalline silicon films to which boron (B) is added as an impurity. The insulating films 42 and 25 are, for example, silicon oxide films.

Figure 11B:
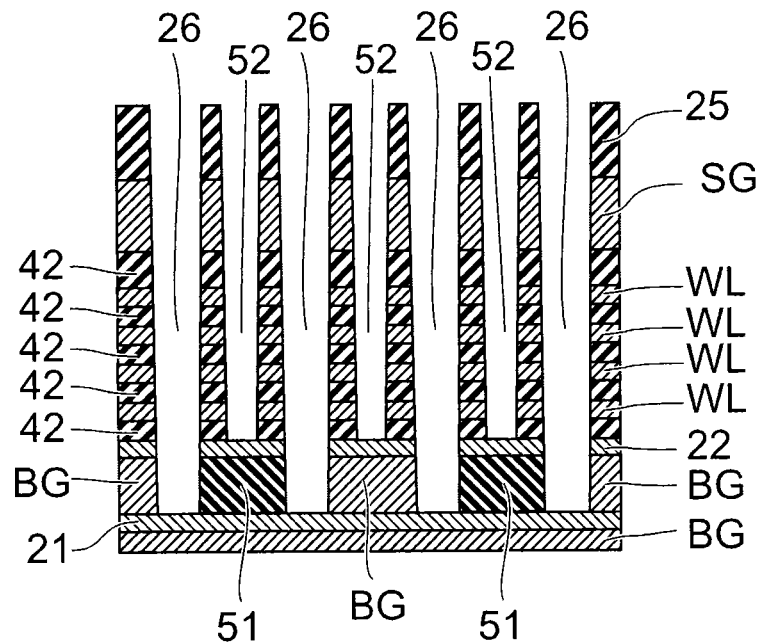

After forming the stacked body shown in FIG. 11A, multiple slits 52 and the multiple holes 26 are made simultaneously as shown in FIG. 11B by RIE using a not-shown mask.

The shift of the alignment between the slits 52 and the holes 26 can be suppressed by simultaneously making the slits 52 and the holes 26 by etching using the same mask.

The slits 52 extend through the stacked body including the insulating film 25, the selection gate SG, the multiple electrode films WL, and the multiple insulating films 42 on the second stopper film 22 in the stacking direction of these films. Further, the slits 52 extend in the direction piercing the page surface of FIG. 11B to divide the stacked body recited above that is on the second stopper film 22 in the lateral direction (in FIG. 13B, the Y-direction).

The holes 26 extend through the insulating film 25, the selection gates SG, the multiple insulating films 42, and the multiple electrode films WL in the stacking direction of these films to reach the first stopper film 21 by piercing the opening 22a made in the second stopper film 22 and the sacrificial film 51 under the opening 22a.

Figure 13A:
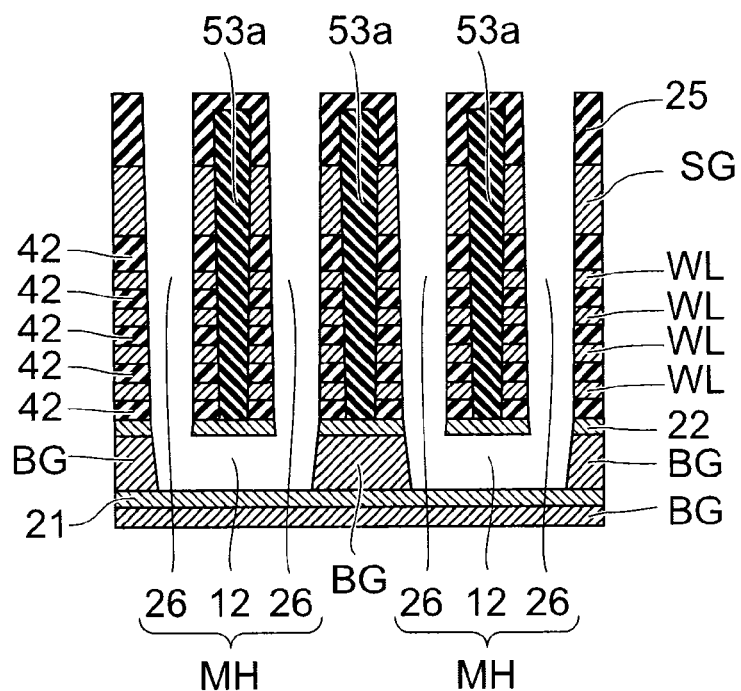
Figure 13B:
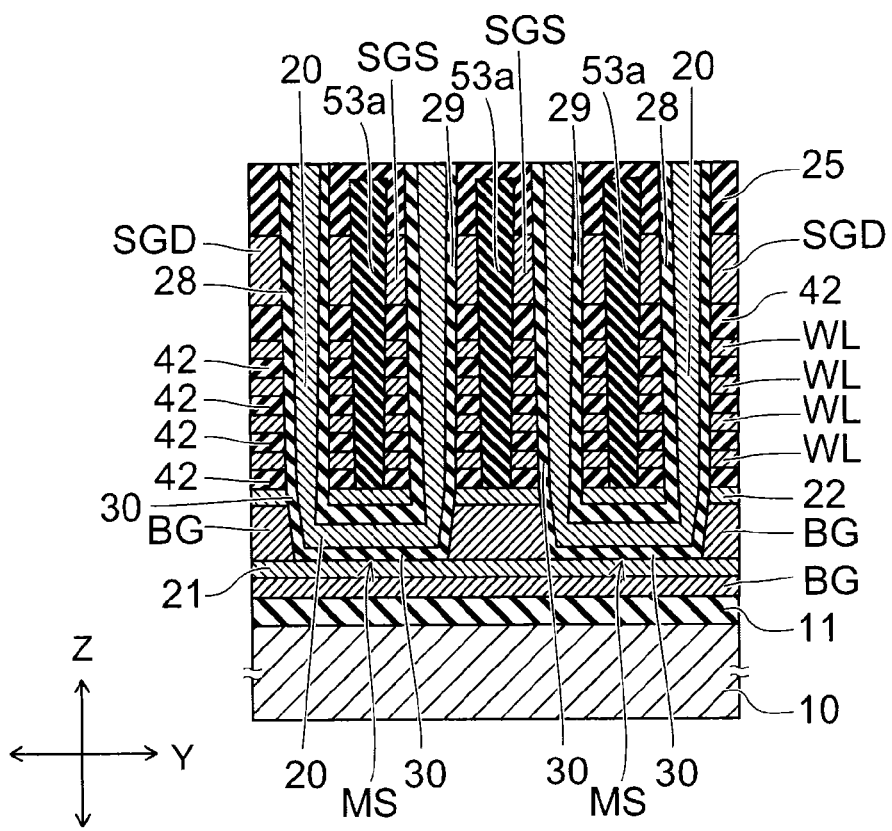

The sacrificial film 51 remains between the lower end portions of the pair of holes 26 adjacent to each other in the lateral direction of FIG. 11B (in FIG. 13B, the Y-direction). The side surfaces of the sacrificial film 51 face the holes 26.

The insulating film 25, the selection gate SG, the multiple electrode films WL, the multiple insulating films 42, and the sacrificial film 51 are etched unselectively and collectively by, for example, RIE using the same gas including HBr, $C_4F_8$, $CF_4$, or $NF_3$. The etching gas is not switched between the films.

In the etching, the etching resistance of the first stopper film 21 is higher than that of the insulating film 25, the selection gate SG, the electrode films WL, the insulating films 42, and the sacrificial film 51; and the first stopper film 21 is substantially not etched. Accordingly, the etching can be reliably stopped at the first stopper film 21; and the holes 26 do not extend through to the substrate 10 shown in FIG. 13B.

In other words, the etching that progresses downward from the stacked body recited above is stopped at the first stopper film 21. The first stopper film 21 is exposed at the bottoms of the holes 26.

Also, in the etching recited above, the etching resistance of the second stopper film 22 is higher than that of the insulating film 25, the selection gate SG, the electrode films WL, the insulating films 42, and the sacrificial film 51; and the second stopper film 22 is substantially not etched. Accordingly, the etching can be reliably stopped at the second stopper film 22; and the slits 52 do not extend below the stacked body recited above.

In other words, the etching that progresses downward from the stacked body is stopped at the second stopper film 22. The second stopper film 22 is exposed at the bottoms of the slits 52.

Then, an insulating film is formed inside the slits 52 and inside the holes 26. For example, a silicon nitride film is formed as the insulating film simultaneously inside the slits 52 and inside the holes 26.

Figure 12A:
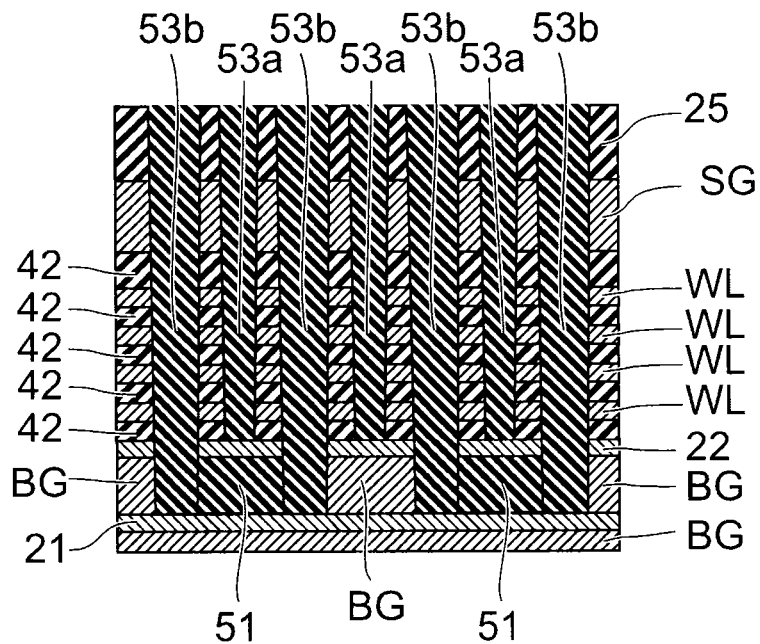

As shown in FIG. 12A, a silicon nitride film is filled into the slits 52 as an insulating separation film 53a. A silicon nitride film is filled into the holes 26 as a sacrificial film 53b.

Figure 12B:
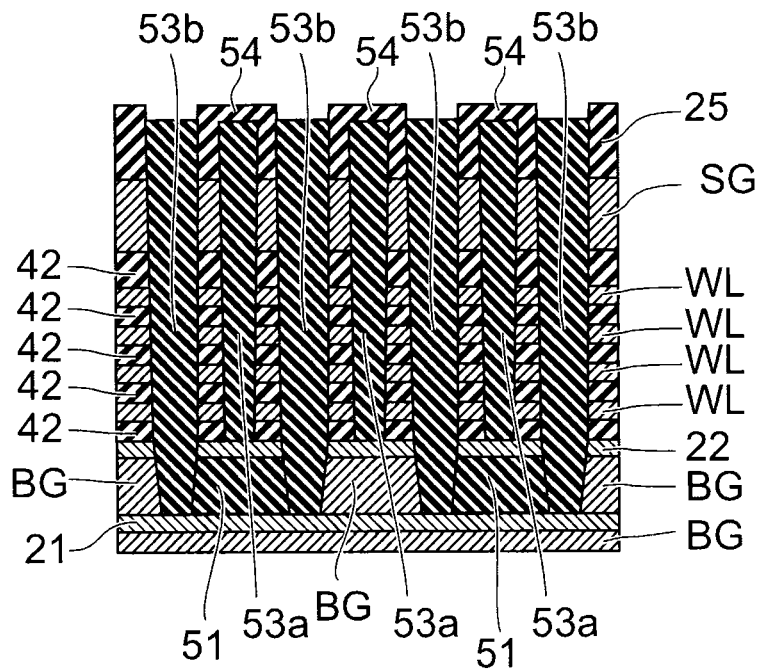

Then, after covering the upper surface of the insulating separation film 53a and the upper surface of the sacrificial film 53b by forming an insulating film on the insulating film 25, the insulating film is selectively removed by etching using a not-shown mask to expose the upper surface of the sacrificial film 53b as shown in FIG. 12B. The state in which the upper surface of the insulating separation film 53a is covered with an insulating film 54 is maintained.

The insulating film 54 is, for example, a silicon oxide film and is a film of a different type of material than the sacrificial film 53b which is a silicon nitride film; and the sacrificial film 53b can be selectively etched using the insulating film 54 as a mask.

The sacrificial film 53b is removed by etching using the insulating film 54 as a mask. At this time, because the sacrificial film 51 is a silicon nitride film as is the sacrificial film 53b, the sacrificial film 51 that remains inside the recesses 12 of the back gate BG also is removed simultaneously.

The sacrificial film 53b and the sacrificial film 51 are removed by, for example, chemical liquid processing (wet etching) using phosphoric acid. After removing the sacrificial film 53b that is inside the holes 26, the sacrificial film 51 inside the recesses 12 of the back gate BG is removed via the holes 26.

At this time, the first stopper film 21 and the second stopper film 22 also have resistance to the chemical liquid processing and are not etched.

By the removal of the sacrificial film 53b and the sacrificial film 51, the bottoms of a pair of holes 26 communicate with one common recess 12 to make the memory hole MH in a U-shaped configuration as shown in FIG. 13A.

After making the memory hole MH, the memory film 30 is formed on the inner wall of the memory hole MH as shown in FIG. 13B. After forming the memory film 30, the channel body 20 is formed on the inner side of the memory film 30 inside the memory hole MH. The memory film 30 and the channel body 20 also are formed inside the recess 12 of the back gate BG.

Subsequently, not-shown contacts, the source line SL and the bit lines BL shown in FIG. 1, etc., are formed.

According to the embodiment described above, the first stopper film 21 and the second stopper film 22 are formed respectively on the lower layer portion of the back gate BG and the upper surface of the back gate BG.

Therefore, when making the slits 52 and the holes 26 in the stacked body in which the multiple electrode films WL and the multiple insulating films 42 are stacked alternately with each other, the etching can be stopped reliably at the first stopper film 21 and the second stopper film 22 while efficiently etching the multiple electrode films WL and the multiple insulating films 42 by unselective etching without switching the etching gas between the films.

Because the etching is unselective etching, compared to step etching in which the etching gas is switched between the films of the electrode films WL and the insulating films 42, the processing time is short; and the side etching can be suppressed such that it is possible to make the slits 52 and the holes 26 to extend substantially perpendicular to the front surface of the substrate 10.

A method for manufacturing a semiconductor memory device according to a third embodiment will now be described with reference to FIG. 14A to FIG. 19B.

Figure 14A:
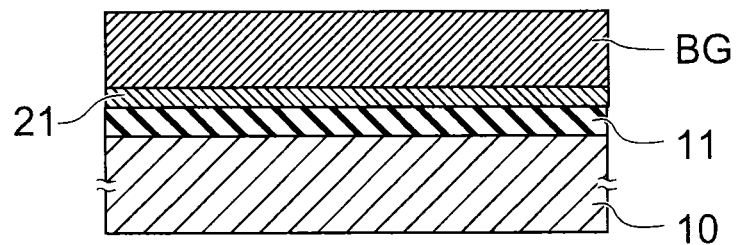
FIG. 14A to FIG. 19B are schematic cross-sectional views showing a method for manufacturing a semiconductor memory device according to a third embodiment.

As shown in FIG. 14A, the first stopper film 21 is formed on the substrate 10 with the insulating film 11 interposed; and the back gate BG is formed on the first stopper film 21.

Figure 14B:
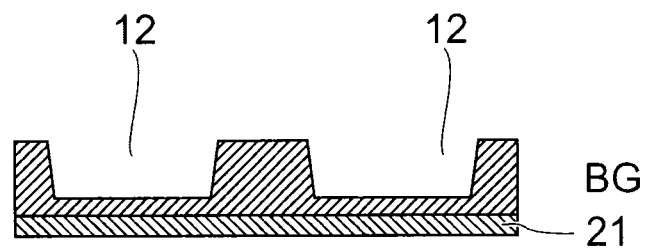

As shown in FIG. 14B, the multiple recesses 12 are made in the back gate BG by etching using a not-shown resist film. The bottoms of the recesses 12 do not reach the first stopper film 21; and the first stopper film 21 is not exposed at the bottoms of the recesses 12.

Figure 14C:
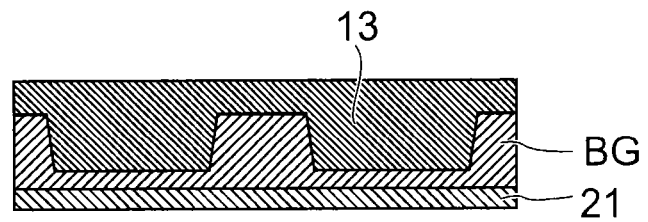

As shown in FIG. 14C, the sacrificial film 13 is filled into the recesses 12. The sacrificial film 13 is, for example, a non-doped polycrystalline silicon film.

Figure 14D:
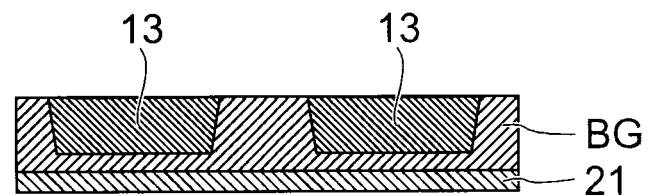

Etch-back of the sacrificial film 13 is performed to expose the upper surface of the back gate BG as shown in FIG. 14D. The upper surface of the sacrificial film 13 is caused to be the same height as the upper surface of the back gate BG.

Figure 15A:
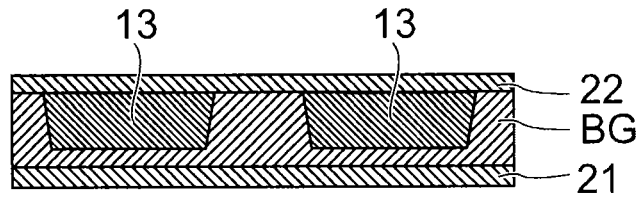

As shown in FIG. 15A, the second stopper film 22 is formed on the upper surface of the back gate BG and on the upper surface of the sacrificial film 13.

Figure 15B:
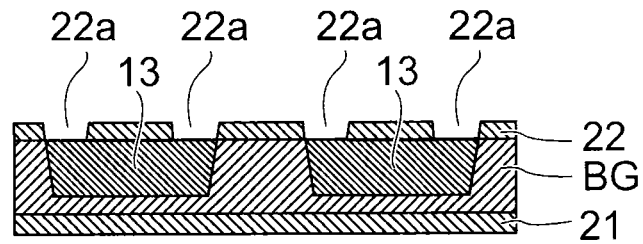

As shown in FIG. 15B, the opening 22a is made in the second stopper film 22 using a not-shown resist film. A portion of the sacrificial film 13 is exposed in the opening 22a. An opening is not made in the second stopper film 22 that is formed on the upper surface of the back gate BG; and the back gate BG is not exposed.

Figure 15C:
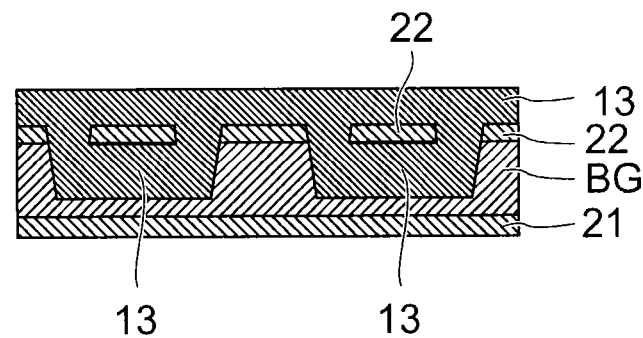

Then, as shown in FIG. 15C, the sacrificial film 13 is deposited again onto the second stopper film 22 to fill the opening 22a.

Figure 15D:
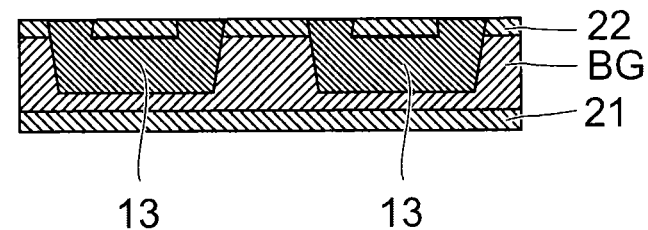

Etch-back of the sacrificial film 13 that is on the second stopper film 22 is performed to remove the sacrificial film 13 that is on the second stopper film 22 as shown in FIG. 15D. At this time, the second stopper film 22 has etching resistance to the etching and functions as an etching stopper.

The second stopper film 22 is exposed to planarize to cause the upper surface of the sacrificial film 13 filled into the opening 22a to be substantially the same height as the upper surface of the second stopper film 22. Thereby, the flatness of each of the films of the stacked body that is formed in subsequent processes can be ensured.

Figure 16A:
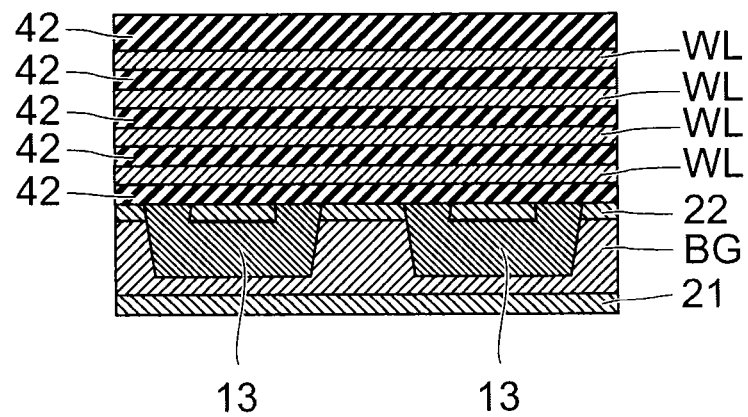
Figure 16B:
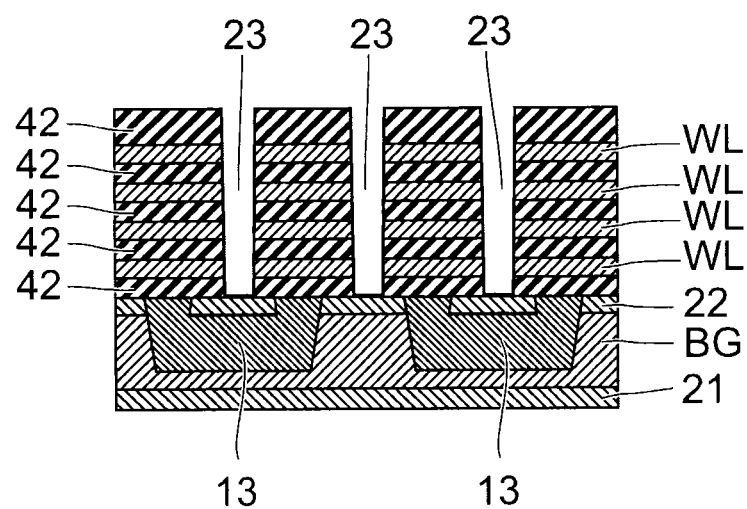

As shown in FIG. 16A, the insulating films 42 and the electrode films WL are multiply stacked alternately with each other on the second stopper film 22 and on the sacrificial film 13. The insulating film 42 is formed in the uppermost layer.

After forming the stacked body shown in FIG. 16A, the multiple slits 23 are made by RIE using a not-shown mask. The slits 23 extend in the stacking direction of the electrode films WL and the insulating films 42 through the stacked body that is on the second stopper film 22. Further, the slits 23 extend in the direction piercing the page surface of FIG. 16B to divide the stacked body that is on the second stopper film 22 in the lateral direction (in FIG. 19B, the Y-direction).

The multiple electrode films WL and the multiple insulating films 42 that are stacked alternately with each other are etched unselectively and collectively by, for example, RIE using the same gas including HBr, $C_4F_8$, $CF_4$, or $NF_3$. The etching gas is not switched between the films.

In the etching, the etching resistance of the second stopper film 22 is higher than that of the electrode films WL and the insulating films 42; and the second stopper film 22 is substantially not etched. Accordingly, the etching can be reliably stopped at the second stopper film 22; and the slits 23 do not extend below the stacked body recited above.

In other words, the etching that progresses downward from the stacked body is stopped at the second stopper film 22. The second stopper film 22 is exposed at the bottoms of the slits 23.

Figure 17A:
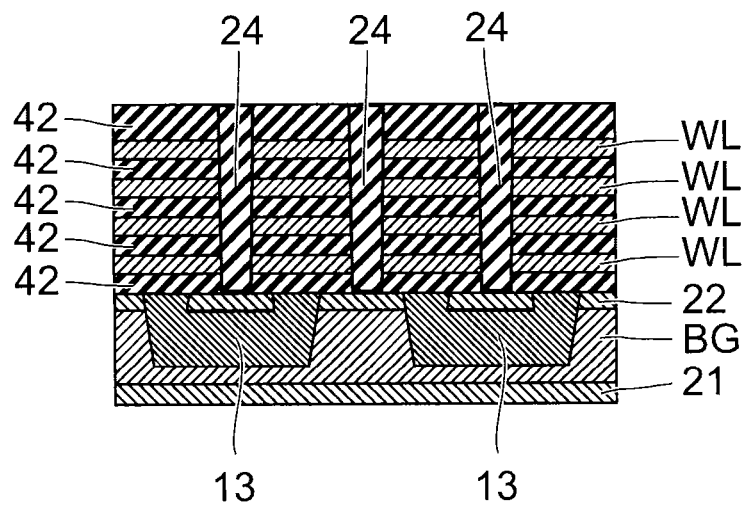

As shown in FIG. 17A, the insulating separation film 24 is filled into the slits 23. The insulating separation film 24 is, for example, a silicon nitride film.

Figure 17B:
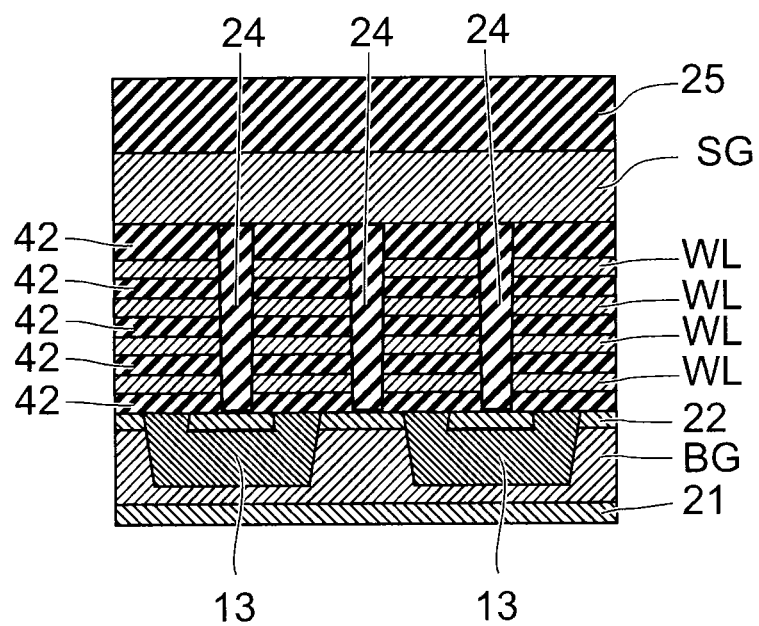

As shown in FIG. 17B, the selection gate SG is formed as the upper gate layer on the insulating film 42 of the uppermost layer and on the upper surface of the insulating separation film 24. The insulating film 25 is formed on the selection gate SG.

Figure 18A:
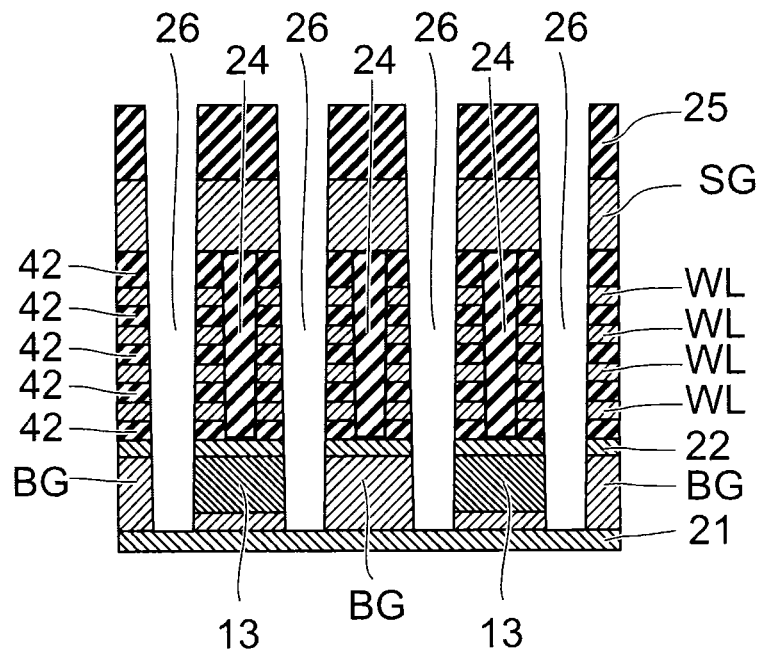

After forming the stacked body shown in FIG. 17B, the multiple holes 26 are made in the stacked body as shown in FIG. 18A by RIE using a not-shown mask.

The holes 26 extend through the insulating film 25, the selection gates SG, the multiple insulating films 42, and the multiple electrode films WL in the stacking direction of these films to reach the first stopper film 21 by piercing the opening 22a made in the second stopper film 22 and the sacrificial film 13 under the opening 22a.

Figure 19A:
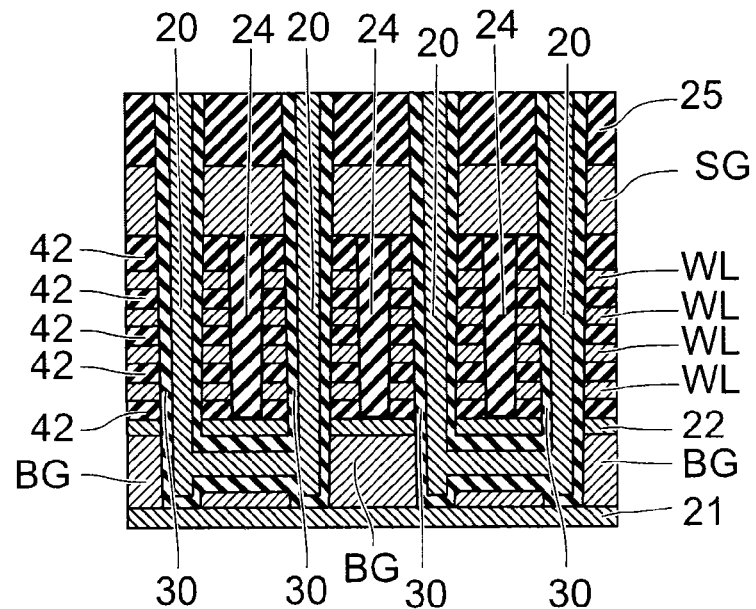
Figure 19B:
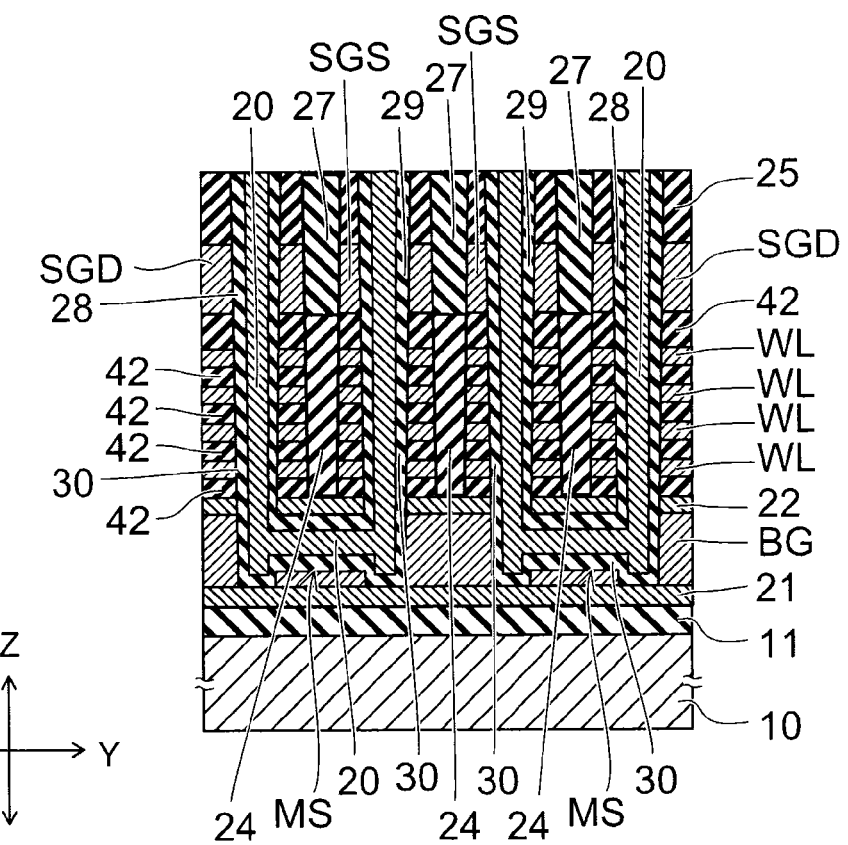

The sacrificial film 13 remains between the lower end portions of the pair of holes 26 adjacent to each other in the lateral direction of FIG. 18A (in FIG. 19B, the Y-direction). The side surfaces of the sacrificial film 13 face the holes 26.

The insulating film 25, the selection gate SG, the multiple electrode films WL, the multiple insulating films 42, and the sacrificial film 13 are etched unselectively and collectively by, for example, RIE using the same gas including HBr, $C_4F_8$, $CF_4$, or $NF_3$. The etching gas is not switched between the films.

In the etching, the etching resistance of the first stopper film 21 is higher than that of the insulating film 25, the selection gate SG, the electrode films WL, the insulating films 42, and the sacrificial film 13; and the first stopper film 21 is substantially not etched. Accordingly, the etching can be reliably stopped at the first stopper film 21; and the holes 26 do not extend through to the substrate 10 shown in FIG. 19B.

In other words, the etching that progresses downward from the stacked body recited above is stopped at the first stopper film 21. The first stopper film 21 is exposed at the bottoms of the holes 26.

After making the holes 26, the sacrificial film 13 which is the non-doped silicon film is removed via the holes 26 by, for example, chemical liquid processing (wet etching) using TMY (trimethyl-2-hydroxyethyl ammonium hydroxide).

At this time, the first stopper film 21 and the second stopper film 22 have resistance to the chemical liquid processing and are not etched.

Figure 18B:
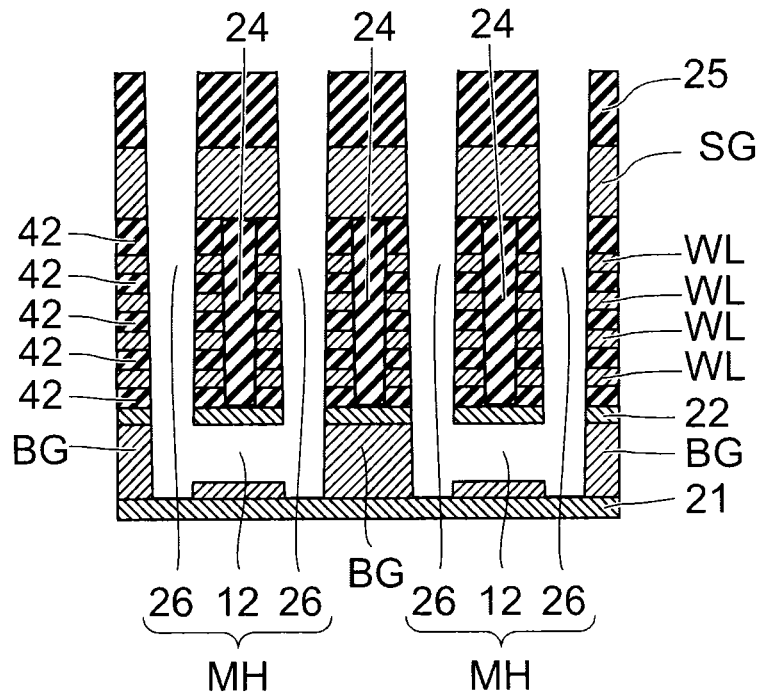

As shown in FIG. 18B, the recesses 12 made in the back gate BG appear by the removal of the sacrificial film 13 remaining inside the recesses 12 of the back gate BG. A pair of holes 26 communicates with one recess 12. In other words, the bottoms of the pair of holes 26 communicate with the one common recess 12 to make one memory hole MH in a U-shaped configuration.

After making the memory hole MH, the memory film 30 is formed on the inner wall of the memory hole MH as shown in FIG. 19A. After forming the memory film 30, the channel body 20 is formed on the inner side of the memory film 30 inside the memory hole MH. The memory film 30 and the channel body 20 also are formed inside the recess 12 of the back gate BG.

Subsequently, the selection gate SG is divided into the drain-side selection gate SGD and the source-side selection gate SGS by slits and the insulating separation film 27 (shown in FIG. 19B) that is filled into the slits. Subsequently, not-shown contacts, the source line SL and the bit lines BL shown in FIG. 1, etc., are formed.

According to the embodiment described above, the first stopper film 21 and the second stopper film 22 are formed respectively on the lower surface and upper surface of the back gate BG.

Therefore, when making the slits 23 and the holes 26 in the stacked body in which the multiple electrode films WL and the multiple insulating films 42 are stacked alternately with each other, the etching can be stopped reliably at the first stopper film 21 and the second stopper film 22 while efficiently etching the multiple electrode films WL and the multiple insulating films 42 by unselective etching without switching the etching gas between the films.

Because the etching is unselective etching, compared to step etching in which the etching gas is switched between the films of the electrode films WL and the insulating films 42, the processing time is short; and the side etching can be suppressed such that it is possible to make the slits 23 and the holes 26 to extend substantially perpendicular to the front surface of the substrate 10.

A method for manufacturing a semiconductor memory device according to a fourth embodiment will now be described with reference to FIG. 20A to FIG. 24B.

Figure 20A:
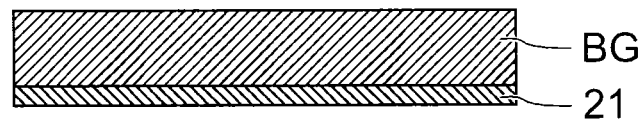
FIG. 20A to FIG. 24B are schematic cross-sectional views showing a method for manufacturing a semiconductor memory device according to a fourth embodiment.

In the fourth embodiment as well, similarly to the third embodiment, the stacked film of the first stopper film 21 and the back gate BG is formed as shown in FIG. 20A. Similarly to the third embodiment shown in FIG. 14A, the stacked film of the first stopper film 21 and the back gate BG is formed on the substrate 10 with the insulating film 11 interposed.

Figure 20B:
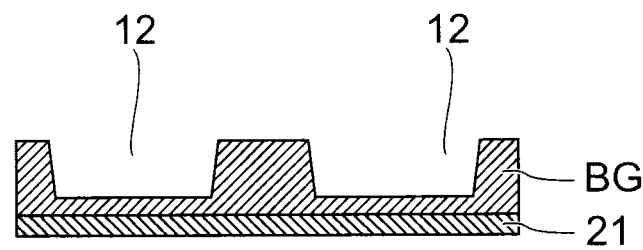

As shown in FIG. 20B, the multiple recesses 12 are made in the back gate BG by etching using a not-shown resist film. The bottoms of the recesses 12 do not reach the first stopper film 21; and the first stopper film 21 is not exposed at the bottoms of the recesses 12.

Figure 20C:
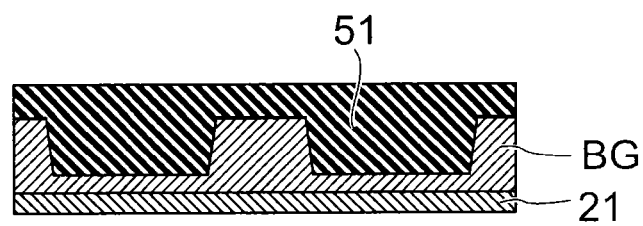

As shown in FIG. 20C, the sacrificial film 51 is filled into the recesses 12. The sacrificial film 51 is, for example, a silicon oxide film.

Figure 20D:
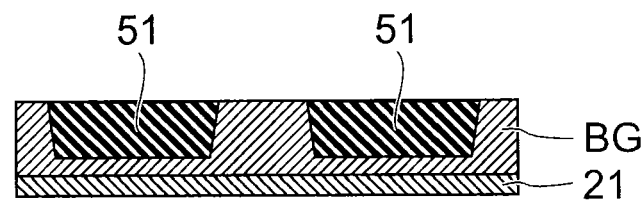

Etch-back of the sacrificial film 51 is performed to expose the upper surface of the back gate BG as shown in FIG. 20D. The upper surface of the sacrificial film 51 is caused to be the same height as the upper surface of the back gate BG.

Figure 21A:
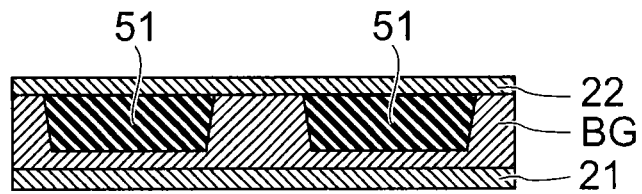

As shown in FIG. 21A, the second stopper film 22 is formed on the upper surface of the back gate BG and on the upper surface of the sacrificial film 51.

Figure 21B:
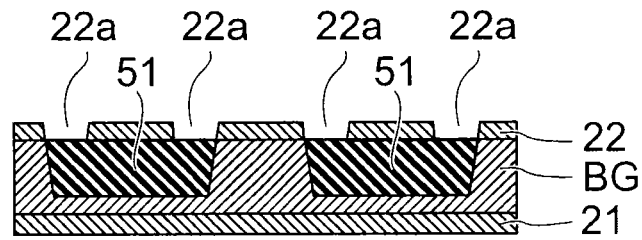

As shown in FIG. 21B, the opening 22a is made in the second stopper film 22 using a not-shown resist film. A portion of the sacrificial film 51 is exposed in the opening 22a. An opening is not made in the second stopper film 22 that is formed on the upper surface of the back gate BG; and the back gate BG is not exposed.

Figure 21C:
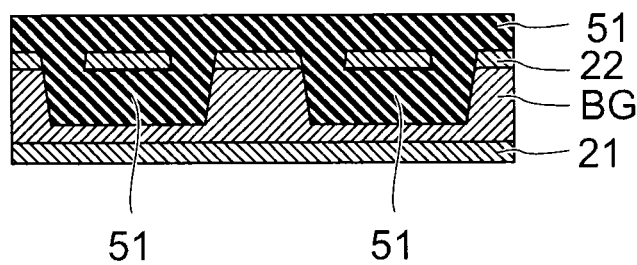

Then, as shown in FIG. 21C, the sacrificial film 51 is deposited again onto the second stopper film 22 to fill the opening 22a.

Figure 21D:
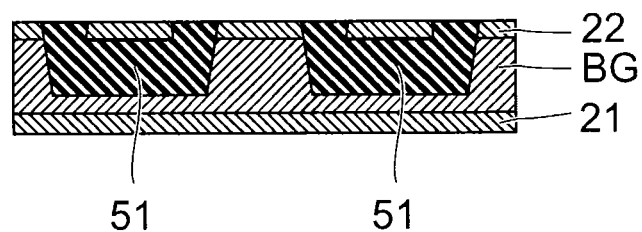

Etch-back of the sacrificial film 51 that is on the second stopper film 22 is performed to remove the sacrificial film 51 that is on the second stopper film 22 as shown in FIG. 21D. At this time, the second stopper film 22 has etching resistance to the etching and functions as an etching stopper.

The second stopper film 22 is exposed to planarize to cause the upper surface of the sacrificial film 51 filled into the opening 22a to be substantially the same height as the upper surface of the second stopper film 22. Thereby, the flatness of each of the films of the stacked body that is formed in subsequent processes can be ensured.

Figure 22A:
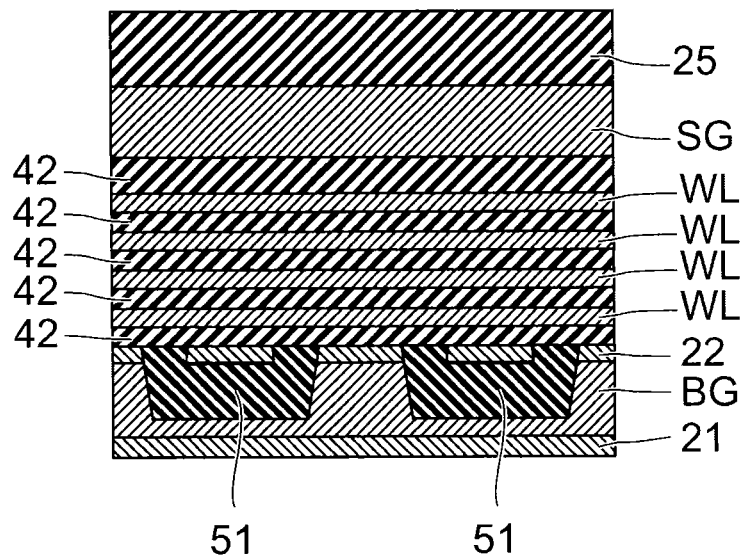

As shown in FIG. 22A, the insulating films 42 and the electrode films WL are multiply stacked alternately with each other on the second stopper film 22 and on the sacrificial film 51. The insulating film 42 is formed in the uppermost layer. Further, the selection gate SG is formed as the upper gate layer on the insulating film 42 of the uppermost layer. The insulating film 25 is formed on the selection gate SG.

Figure 22B:
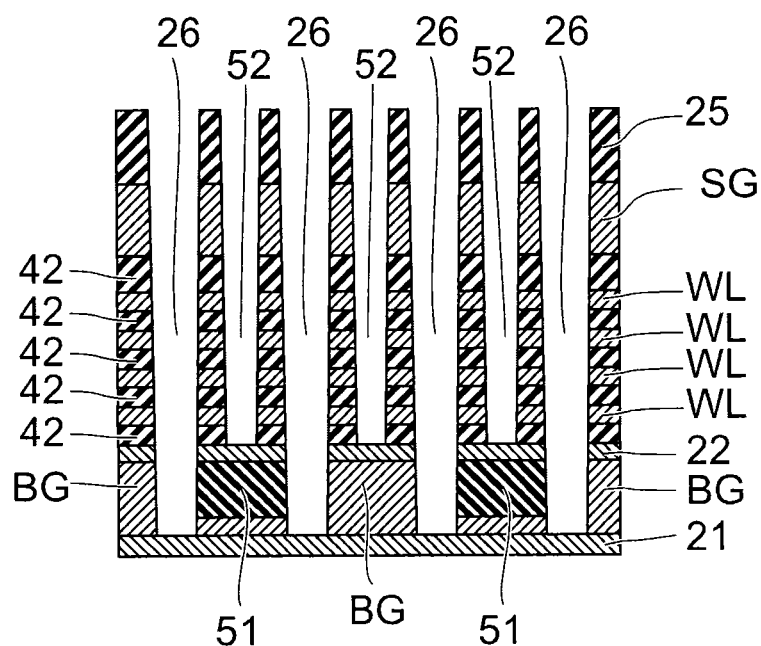

After forming the stacked body shown in FIG. 22A, the multiple slits 52 and the multiple holes 26 are made simultaneously as shown in FIG. 22B by RIE using a not-shown mask.

By etching using the same mask, the shift of the alignment between the slits 52 and the holes 26 can be suppressed by simultaneously making the slits 52 and the holes 26.

The slits 52 extend through the stacked body including the insulating film 25, the selection gate SG, the multiple electrode films WL, and the multiple insulating films 42 on the second stopper film 22 in the stacking direction of these films. Further, the slits 52 extend in the direction piercing the page surface of FIG. 22B to divide the stacked body recited above that is on the second stopper film 22 in the lateral direction (in FIG. 24B, the Y-direction).

The holes 26 extend through the insulating film 25, the selection gates SG, the multiple insulating films 42, and the multiple electrode films WL in the stacking direction of these films to reach the first stopper film 21 by piercing the opening 22a made in the second stopper film 22 and the sacrificial film 51 under the opening 22a.

Figure 24A:
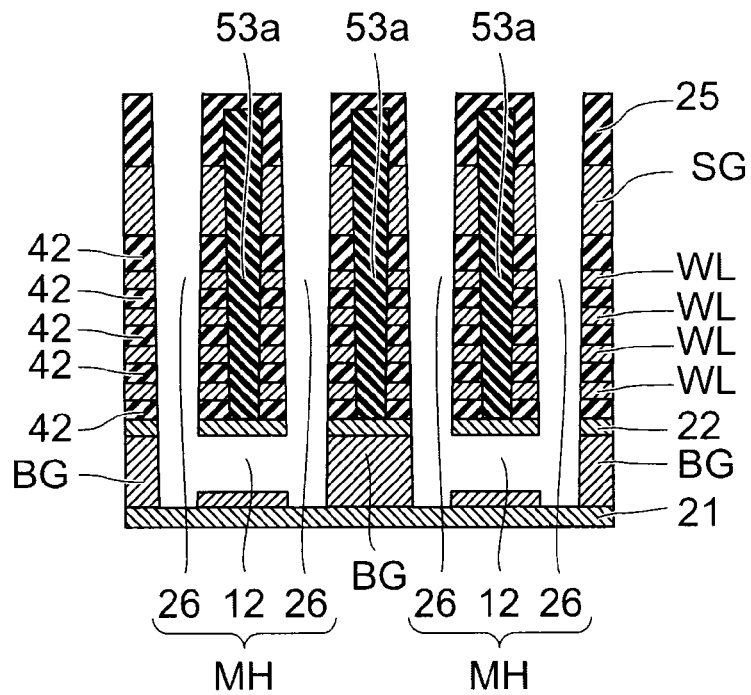
Figure 24B:
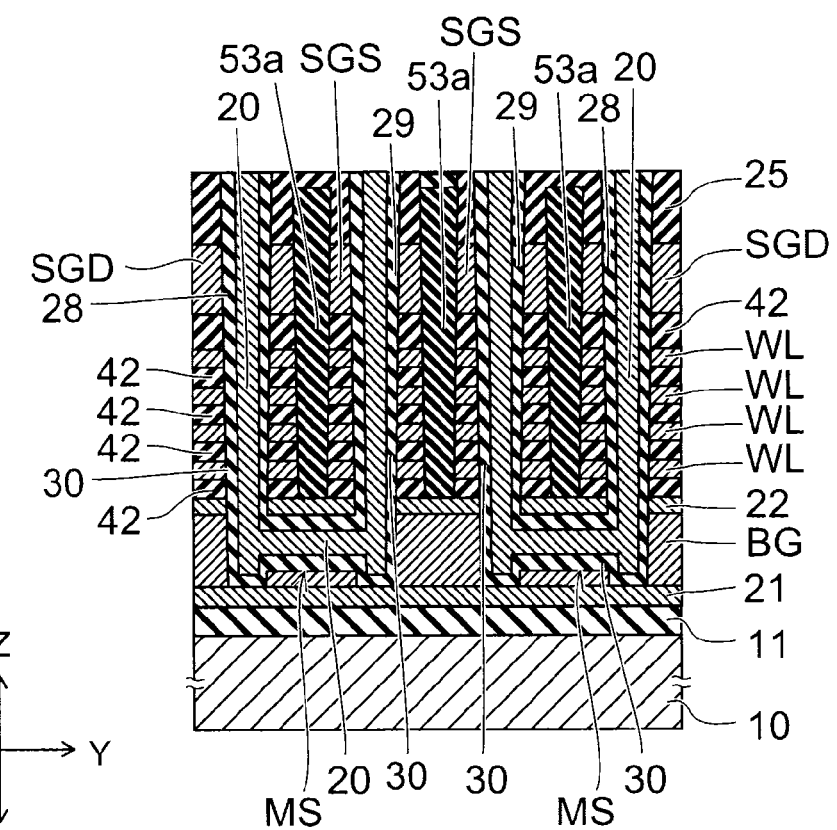

The sacrificial film 51 remains between the lower end portions of the pair of holes 26 adjacent to each other in the lateral direction of FIG. 22B (in FIG. 24B, the Y-direction). The side surfaces of the sacrificial film 51 face the holes 26.

The insulating film 25, the selection gate SG, the multiple electrode films WL, the multiple insulating films 42, and the sacrificial film 51 are etched unselectively and collectively by, for example, RIE using the same gas including HBr, $C_4F_8$, $CF_4$, or $NF_3$. The etching gas is not switched between the films.

In the etching, the etching resistance of the first stopper film 21 is higher than that of the insulating film 25, the selection gate SG, the electrode films WL, the insulating films 42, and the sacrificial film 51; and the first stopper film 21 is substantially not etched. Accordingly, the etching can be reliably stopped at the first stopper film 21; and the holes 26 do not extend through to the substrate 10 shown in FIG. 24B.

In other words, the etching that progresses downward from the stacked body recited above is stopped at the first stopper film 21. The first stopper film 21 is exposed at the bottoms of the holes 26.

In the etching recited above, the etching resistance of the second stopper film 22 also is higher than that of the insulating film 25, the selection gate SG, the electrode films WL, the insulating films 42, and the sacrificial film 51; and the second stopper film 22 is substantially not etched. Accordingly, the etching can be reliably stopped at the second stopper film 22; and the slits 52 do not extend below the stacked body recited above.

In other words, the etching that progresses downward from the stacked body is stopped at the second stopper film 22. The second stopper film 22 is exposed at the bottoms of the slits 52.

Then, an insulating film is formed inside the slits 52 and inside the holes 26. For example, a silicon nitride film is formed as the insulating film simultaneously inside the slits 52 and inside the holes 26.

Figure 23A:
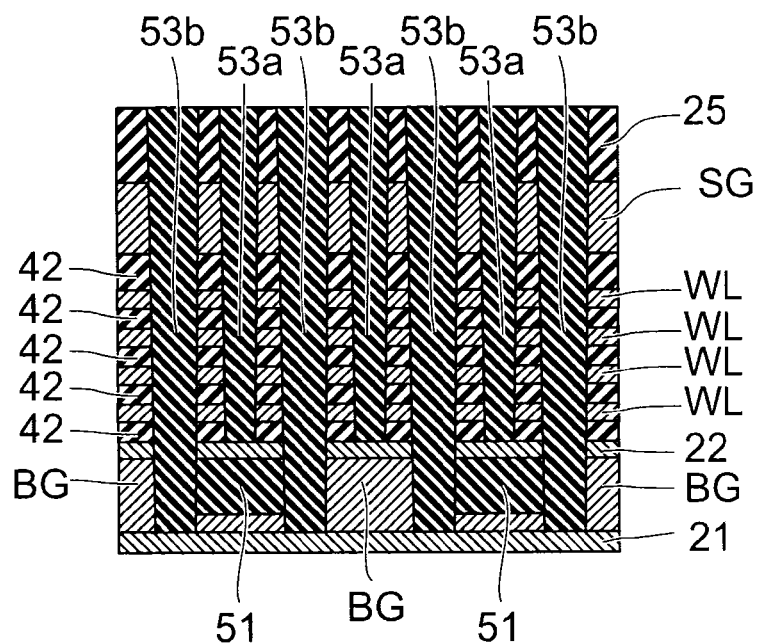

As shown in FIG. 23A, the silicon nitride film is filled as the insulating separation film 53a inside the slits 52. The silicon nitride film is filled as the sacrificial film 53b into the holes 26.

Figure 23B:
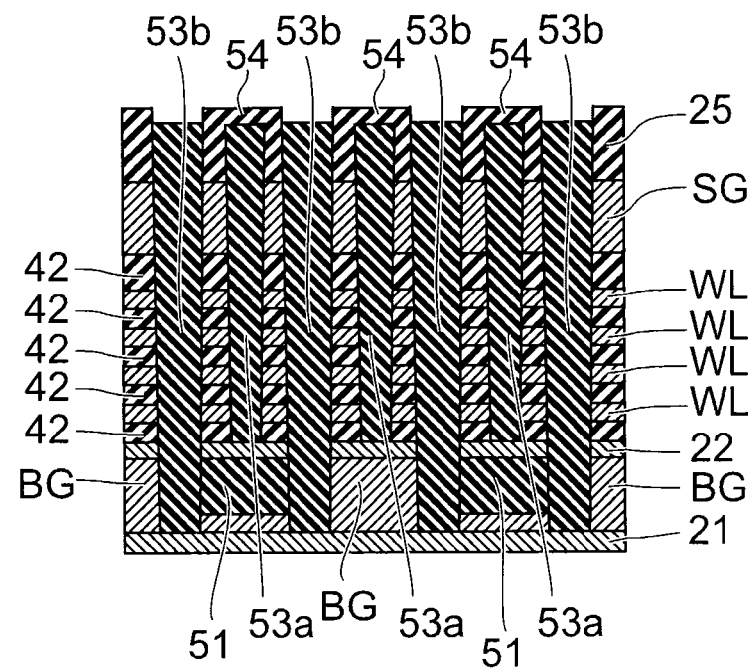

Then, after covering the upper surface of the insulating separation film 53a and the upper surface of the sacrificial film 53b by forming an insulating film on the insulating film 25, the insulating film is removed selectively by etching using a not-shown mask to expose the upper surface of the sacrificial film 53b as shown in FIG. 23B. The state in which the upper surface of the insulating separation film 53a is covered with the insulating film 54 is maintained.

The insulating film 54 is, for example, a silicon oxide film and is a film of a different type of material than the sacrificial film 53b which is a silicon nitride film; and the sacrificial film 53b can be selectively etched using the insulating film 54 as a mask.

The sacrificial film 53b is removed by etching using the insulating film 54 as a mask. At this time, because the sacrificial film 51 is a silicon nitride film as is the sacrificial film 53b, the sacrificial film 51 that remains inside the recesses 12 of the back gate BG also is removed simultaneously.

The sacrificial film 53b and the sacrificial film 51 are removed by, for example, chemical liquid processing (wet etching) using phosphoric acid. After removing the sacrificial film 53b that is inside the holes 26, the sacrificial film 51 that is inside the recesses 12 of the back gate BG is removed via the holes 26.

At this time, the first stopper film 21 and the second stopper film 22 also have resistance to the chemical liquid processing and are not etched.

By the removal of the sacrificial film 53b and the sacrificial film 51, the bottoms of a pair of holes 26 communicate with one common recess 12 to make the memory hole MH in a U-shaped configuration as shown in FIG. 24A.

After making the memory hole MH, the memory film 30 is formed on the inner wall of the memory hole MH as shown in FIG. 24B. After forming the memory film 30, the channel body 20 is formed on the inner side of the memory film 30 inside the memory hole MH. The memory film 30 and the channel body 20 also are formed inside the recess 12 of the back gate BG.

Subsequently, not-shown contacts, the source line SL and the bit lines BL shown in FIG. 1, etc., are formed.

According to the embodiment described above, the first stopper film 21 and the second stopper film 22 are formed respectively on the lower surface and upper surface of the back gate BG.

Therefore, when making the slits 52 and the holes 26 in the stacked body in which the multiple electrode films WL and the multiple insulating films 42 are stacked alternately with each other, the etching can be stopped reliably at the first stopper film 21 and the second stopper film 22 while efficiently etching the multiple electrode films WL and the multiple insulating films 42 by unselective etching without switching the etching gas between the films.

Because the etching is unselective etching, compared to step etching in which the etching gas is switched between the films of the electrode films WL and the insulating films 42, the processing time is short; and the side etching can be suppressed such that it is possible to make the slits 52 and the holes 26 to extend substantially perpendicular to the front surface of the substrate 10.

In the third embodiment and the fourth embodiment, the recesses 12 that are made in the back gate BG may reach the first stopper film 21.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor memory device, comprising:
    forming a first stopper film on a substrate;
    forming a lower gate layer on the first stopper film;
    making a recess in the lower gate layer;
    filling a sacrificial film into the recess;
    forming a second stopper film on the sacrificial film and on the lower gate layer;
    making an opening in the second stopper film to expose a portion of the sacrificial film;
    forming a stacked body on the second stopper film, the stacked body including a plurality of electrode films and a plurality of insulating films provided respectively between the electrode films;
    making a slit in the stacked body to reach the second stopper film;
    forming an insulating separation film inside the slit;
    making a hole in the stacked body to reach the first stopper film by piercing the stacked body and the opening;
    removing the sacrificial film via the hole;
    forming a memory film including a charge storage film on a side wall of the hole; and
    forming a channel body on a side wall of the memory film,
    an etching rate of the first stopper film and the second stopper film being lower than an etching rate of the electrode films and the insulating films in the etching to make the slit and the etching to make the hole.

2. The method according to claim 1, wherein the electrode films and the insulating films are etched unselectively and collectively when making the slit and when making the hole.

3. The method according to claim 2, wherein
    the electrode films are silicon films containing an impurity,
    the insulating films are silicon oxide films, and
    the silicon films and the insulating films are etched collectively by RIE (Reactive Ion Etching) using a gas including HBr, $C_4F_8$, $CF_4$, or $NF_3$ when making the slit and when making the hole.

4. The method according to claim 3, wherein the sacrificial film is a non-doped silicon film.

5. The method according to claim 4, wherein the non-doped silicon film is removed by using TMY (trimethyl-2-hydroxyethyl ammonium hydroxide).

6. The method according to claim 3, wherein the sacrificial film is a silicon nitride film.

7. The method according to claim 6, wherein the silicon nitride film is removed by using phosphoric acid.

8. The method according to claim 1, wherein the first stopper film is a film including at least one selected from gold, silver, platinum, palladium, tantalum nitride, tantalum oxide, and aluminum oxide.

9. The method according to claim 1, wherein the second stopper film is a film including at least one selected from gold, silver, platinum, palladium, tantalum nitride, tantalum oxide, and aluminum oxide.

10. The method according to claim 1, further comprising:
    forming a second sacrificial film on the second stopper film to fill the opening after making the opening in the second stopper film and prior to forming the stacked body, the second sacrificial film being of a same material as the sacrificial film; and
    planarizing by removing the second sacrificial film on the second stopper film to cause an upper surface of the second sacrificial film filled into the opening to be a same height as an upper surface of the second stopper film.

11. The method according to claim 1, further comprising forming an upper gate layer on the stacked body after forming the insulating separation film inside the slit,
    the hole also being made to pierce the upper gate layer.

12. The method according to claim 1, wherein
    the forming of the stacked body includes forming an upper gate layer on the electrode film of the uppermost layer with the insulating film interposed, and
    simultaneously making the slit and the hole to pierce the upper gate layer and the stacked body.

13. The method according to claim 12, wherein
    the same film as the insulating separation film is also formed inside the hole simultaneously when forming the insulating separation film inside the slit, the film formed inside the hole is removed after covering the insulating separation film with a mask from above, and the memory film is formed inside the hole after removing the film from the hole.

14. The method according to claim 13, wherein the film formed inside the hole is a film of a same type of material as the sacrificial film, and the sacrificial film also is removed simultaneously when removing the film from the hole.

15. A semiconductor memory device, comprising:

a substrate;

a first protective film provided on the substrate;

a lower gate layer provided on the first protective film, the lower gate layer being of a different type of material than the first protective film;

a second protective film provided on the lower gate layer, the second protective film being of a different type of material than the lower gate layer;

a stacked body provided on the second protective film, the stacked body including a plurality of electrode films and a plurality of insulating films provided respectively between the electrode films, the electrode films being of a different type of material than the first protective film and the second protective film, the insulating films being of a different type of material than the first protective film and the second protective film;

a channel body extending through the stacked body in a stacking direction of the electrode films and the insulating films a memory film including a charge storage film provided between a side wall of the channel body and each of the electrode films, and provided between the channel body and the lower gate layer; and an insulating separation film extending through the stacked body in the stacking direction of the electrode films and the insulating films on the second protective film to reach the second protective film.

16. The device according to claim 15, wherein the electrode films are silicon films containing an impurity.

17. The device according to claim 15, wherein the insulating films are silicon oxide films.

18. The device according to claim 15, wherein the first protective film is a film including at least one selected from gold, silver, platinum, palladium, tantalum nitride, tantalum oxide, and aluminum oxide.

19. The device according to claim 15, wherein the second protective film is a film including at least one selected from gold, silver, platinum, palladium, tantalum nitride, tantalum oxide, and aluminum oxide.

20. The device according to claim 15, wherein the channel body is formed in a U-shaped configuration to include a pair of columnar portions extending in the stacking direction through the stacked body, and a linking portion provided inside the lower gate layer to link the pair of columnar portions.

* * * * *